(12) United States Patent
Chang et al.

(10) Patent No.: US 10,865,100 B2
(45) Date of Patent: Dec. 15, 2020

(54) METHOD FOR FORMING MICRO-ELECTRO-MECHANICAL SYSTEM (MEMS) STRUCTURE

(71) Applicant: Taiwan Semiconductor Manufacturing Co., Ltd., Hsinchu (TW)

(72) Inventors: Kai-Fung Chang, Taipei (TW); Lien-Yao Tsai, Hsinchu (TW); Len-Yi Leu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/448,518

(22) Filed: Jun. 21, 2019

(65) Prior Publication Data

US 2019/0315620 A1 Oct. 17, 2019

Related U.S. Application Data

(62) Division of application No. 15/896,405, filed on Feb. 14, 2018, now Pat. No. 10,343,895.

(Continued)

(51) Int. Cl.
*B81B 7/00* (2006.01)
*B81C 1/00* (2006.01)

(52) U.S. Cl.
CPC ............ *B81B 7/0006* (2013.01); *B81B 7/007* (2013.01); *B81C 1/00095* (2013.01);
(Continued)

(58) Field of Classification Search
CPC ............ B81C 1/00238; B81C 1/00246; B81C 1/00095; B81C 1/00301; B81B 7/007; B81B 7/0006; H01L 24/81
(Continued)

(56) References Cited

U.S. PATENT DOCUMENTS

| 2005/0260783 | A1 | 11/2005 | Lutz et al. | |
| 2012/0267773 | A1* | 10/2012 | Ebefors | H01L 21/6835 257/692 |
| 2013/0193527 | A1* | 8/2013 | Chu | B81B 7/007 257/414 |
| 2013/0277777 | A1 | 10/2013 | Chang et al. | |
| 2014/0054742 | A1 | 2/2014 | Katti | |
| 2015/0175407 | A1* | 6/2015 | Cheng | B81C 1/00246 257/415 |

(Continued)

FOREIGN PATENT DOCUMENTS

| CN | 101459210 A | 6/2009 |
| CN | 102779807 A | 11/2012 |

(Continued)

*Primary Examiner* — Didarul A Mazumder
(74) *Attorney, Agent, or Firm* — Birch, Stewart, Kolasch & Birch, LLP

(57) ABSTRACT

A method for forming a micro-electro-mechanical system (MEMS) device structure is provided. The method includes forming a substrate over a micro-electro-mechanical system (MEMS) substrate. The substrate includes a semiconductor via. The method also includes forming a dielectric layer over a top surface of the substrate, and forming a polymer layer over the dielectric layer. The method further includes patterning the polymer layer to form an opening, and the semiconductor via is exposed by the opening. The method includes forming a conductive layer in the opening and over the polymer layer, and forming an under bump metallization (UBM) layer on the conductive layer. The method further includes forming an electrical connector over the UBM layer, wherein the electrical connector is electrically connected to the semiconductor via through the UBM layer.

20 Claims, 26 Drawing Sheets

Related U.S. Application Data

(60) Provisional application No. 62/527,453, filed on Jun. 30, 2017.

(52) U.S. Cl.
CPC ...... *B81C 1/00269* (2013.01); *B81C 1/00301* (2013.01); *B81B 2207/07* (2013.01); *B81B 2207/095* (2013.01); *B81B 2207/096* (2013.01); *B81B 2207/097* (2013.01); *B81B 2207/11* (2013.01); *B81C 2203/035* (2013.01); *B81C 2203/0792* (2013.01)

(58) Field of Classification Search
USPC ........ 257/774; 438/629, 637, 639, 640, 667, 438/668, 672, 675, 700, 701, 713, 978
See application file for complete search history.

(56) References Cited

U.S. PATENT DOCUMENTS

| | | | |
|---|---|---|---|
| 2015/0311168 A1* | 10/2015 | Yu | H01L 24/81 257/737 |
| 2015/0329351 A1* | 11/2015 | Cheng | B81C 1/00238 257/417 |

FOREIGN PATENT DOCUMENTS

| | | |
|---|---|---|
| CN | 103224216 A | 7/2013 |
| CN | 203269551 U | 11/2013 |
| CN | 103832964 A | 6/2014 |
| CN | 103922267 A | 7/2014 |
| CN | 106373930 A | 2/2017 |
| TW | 201526205 A | 7/2015 |

* cited by examiner

METHOD FOR FORMING MICRO-ELECTRO-MECHANICAL SYSTEM (MEMS) STRUCTURE

CROSS REFERENCE TO RELATED APPLICATIONS

This application is a Divisional application of U.S. patent application Ser. No. 15/896,405, filed on Feb. 14, 2018, which claims the benefit of U.S. Provisional Application No. 62/527,453 filed on Jun. 30, 2017, and entitled "Micro-electro-mechanical system (MEMS) structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

Micro-electro mechanical system (MEMS) devices have recently been developed. MEMS devices include devices fabricated using semiconductor technology to form mechanical and electrical features. Examples of the MEMS devices include gears, levers, valves, and hinges. The MEMS devices are implemented in accelerometers, pressure sensors, microphones, actuators, mirrors, heaters, and/or printer nozzles.

Although existing devices and methods for forming the MEMS devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
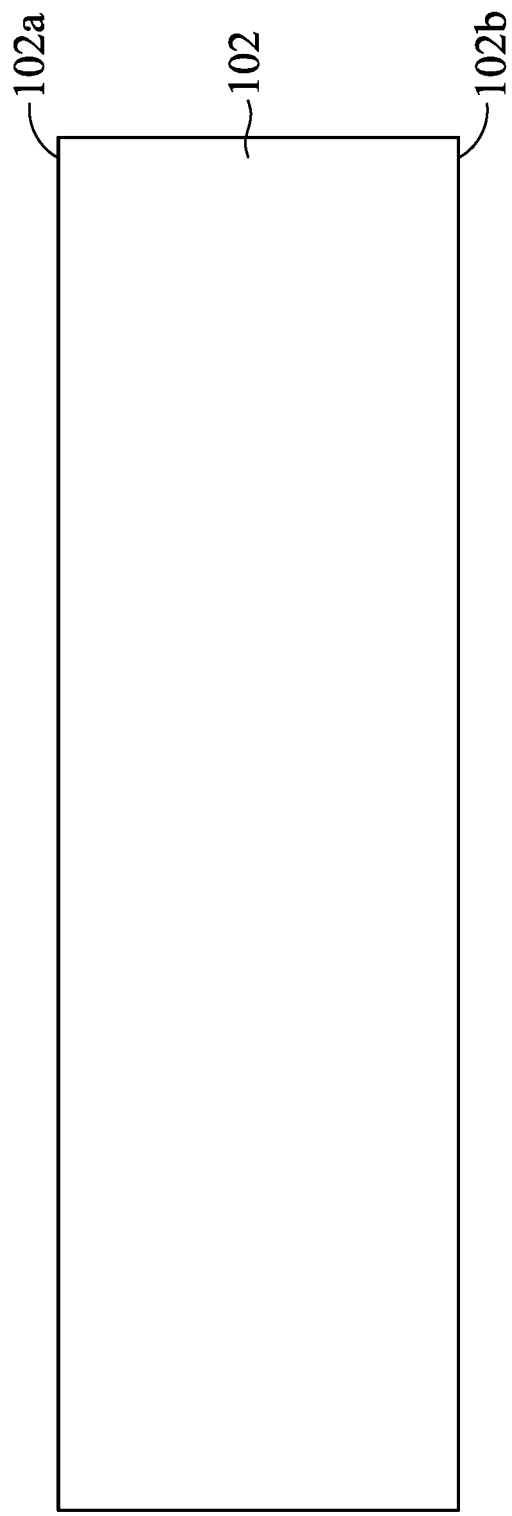
FIGS. 1A-1M show cross-sectional representations of various stages of forming a micro-electro-mechanical system (MEMS) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a micro-electro-mechanical system (MEMS) device structure are provided. FIGS. 1A-1M show cross-sectional representations of various stages of forming a micro-electro-mechanical system (MEMS) device structure 100, in accordance with some embodiments of the disclosure.

As shown in FIG. 1A, a substrate 102 is provided. In some embodiments, the substrate 102 is a cap substrate. The substrate 102 includes a first surface 102a and a second surface 102b. In some embodiments, the substrate 102 is a wafer. In some embodiments, the substrate 102 is made of silicon, or another elementary semiconductor. In some embodiments, the substrate 102 is doped with some dopants to increase the conductivity of the substrate 102. For example, the dopants may be p-type dopants, such as boron or $BF_2$, and/or n-type dopants, such as phosphorus (P) or arsenic (As). In some embodiments, the substrate 102 is made of silicon carbide, gallium arsenic, indium arsenide, indium phosphide, or other applicable materials.

Figure 1B:
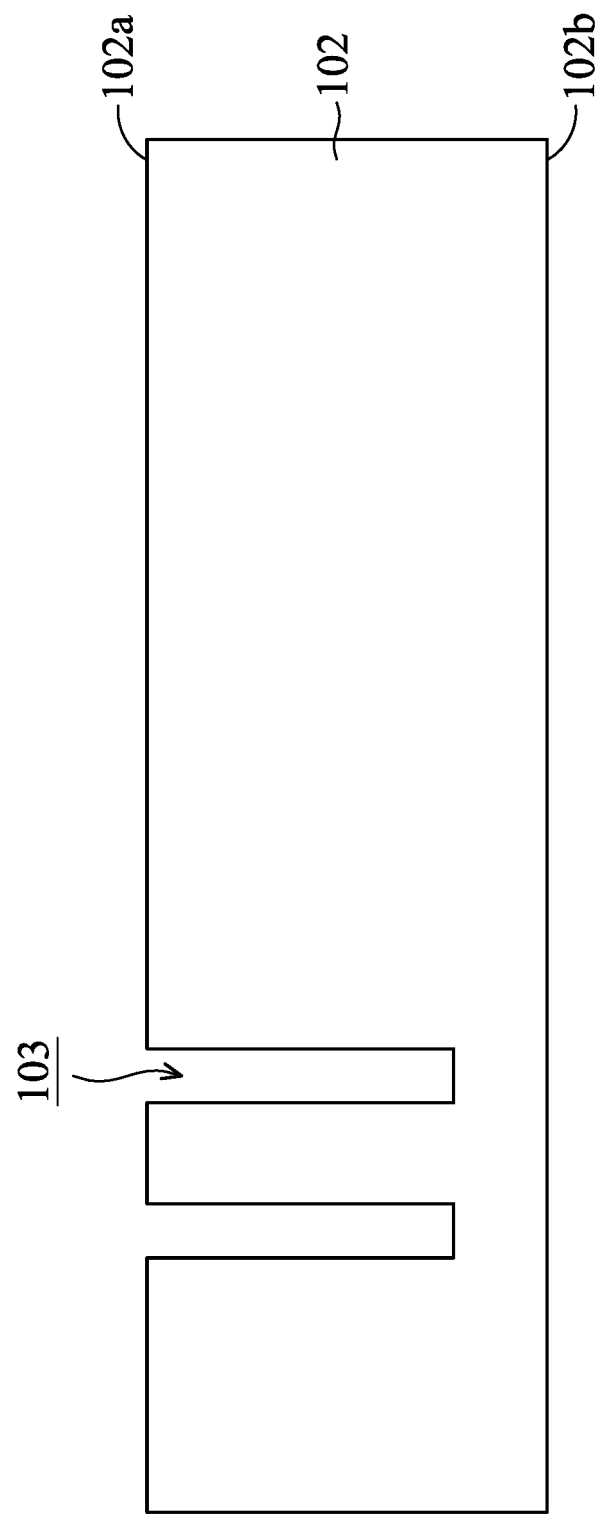

Afterwards, as shown in FIG. 1B, two trenches 103 are formed in the substrate 102, in accordance with some embodiments of the disclosure. More specifically, the trenches 103 extend into the substrate 102 from the first surface 102a. The depth of each of the trenches 103 is greater than half of the thickness of the substrate 102. In some embodiments, the trenches 103 are formed by an etching process, such as a dry etching process or a wet etching process.

Figure 1C:
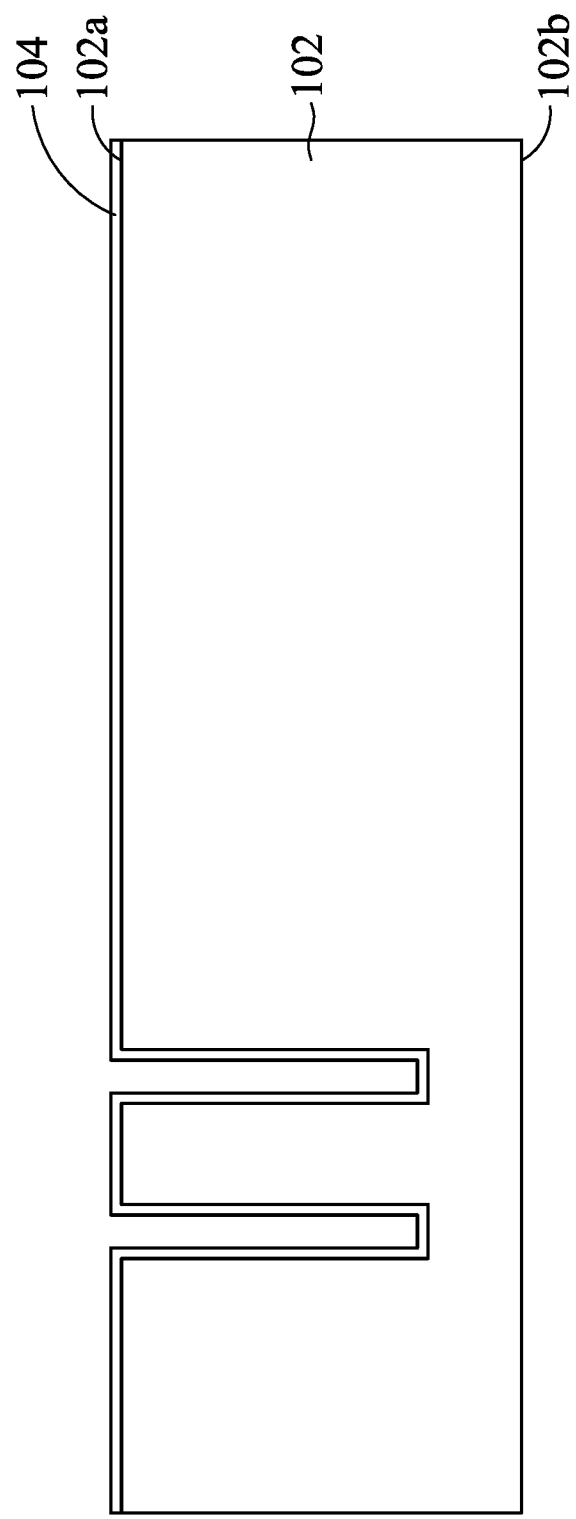

Next, as shown in FIG. 1C, an isolation layer 104 is formed on sidewalls, the bottom surface of the trenches 103 and on the first surface 102a of the substrate 102, in accordance with some embodiments of the disclosure. The isolation layer 104 is used as barrier layer or an isolation layer. In some other embodiments, the trenches 103 are completely filled with the isolation layer 104.

In some embodiments, the isolation layer 104 is made of silicon nitride, silicon oxynitride, silicon carbide, silicon oxycarbide, silicon carbon nitride or a combination thereof.

In some embodiments, the isolation layer 104 is formed by a chemical vapor deposition (CVD) process, a spin-on process, a sputtering process, or a combination thereof.

Figure 1D:
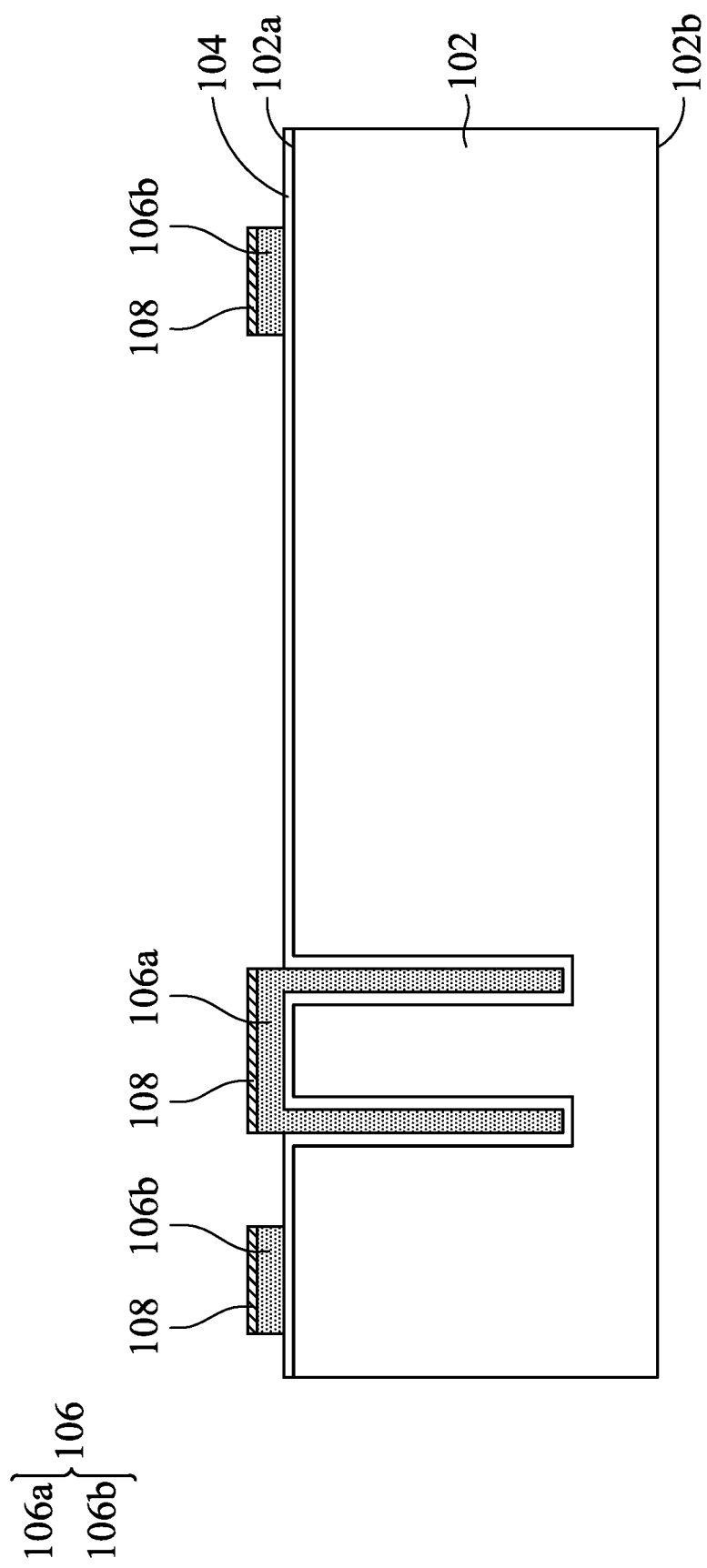

Afterwards, as shown in FIG. 1D, the polysilicon layer 106 is formed in the trenches 103 and on the isolation layer 104, in accordance with some embodiments of the disclosure. Next, a first bonding layer 108 is formed on the top surface of the polysilicon layer 106. The polysilicon layer 106 and the first bonding layer 108 are patterned by a photolithography process and an etching process. In some other embodiments, the polysilicon layer 106 is formed on the first surface 102a of the substrate 102 when the trenches 103 are filled with the isolation layer 104.

After patterning the polysilicon layer 106 and the first bonding layer 108, the polysilicon layer 106 includes a first portion 106a and a second portion 106b. The first portion 106a extends from a first position which is adjacent to the substrate 102 to a second position which is at the first surface 102a of the substrate 102. The first portion 106a of the polysilicon layer 106 is used to provide an electrical connection to other structures or devices. The second portion 106b is formed on the second surface 102b of the substrate 102. The second portion 106b of the polysilicon layer 106 is used to connect and bond the first bonding layer 108.

The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process.

Figure 1E:
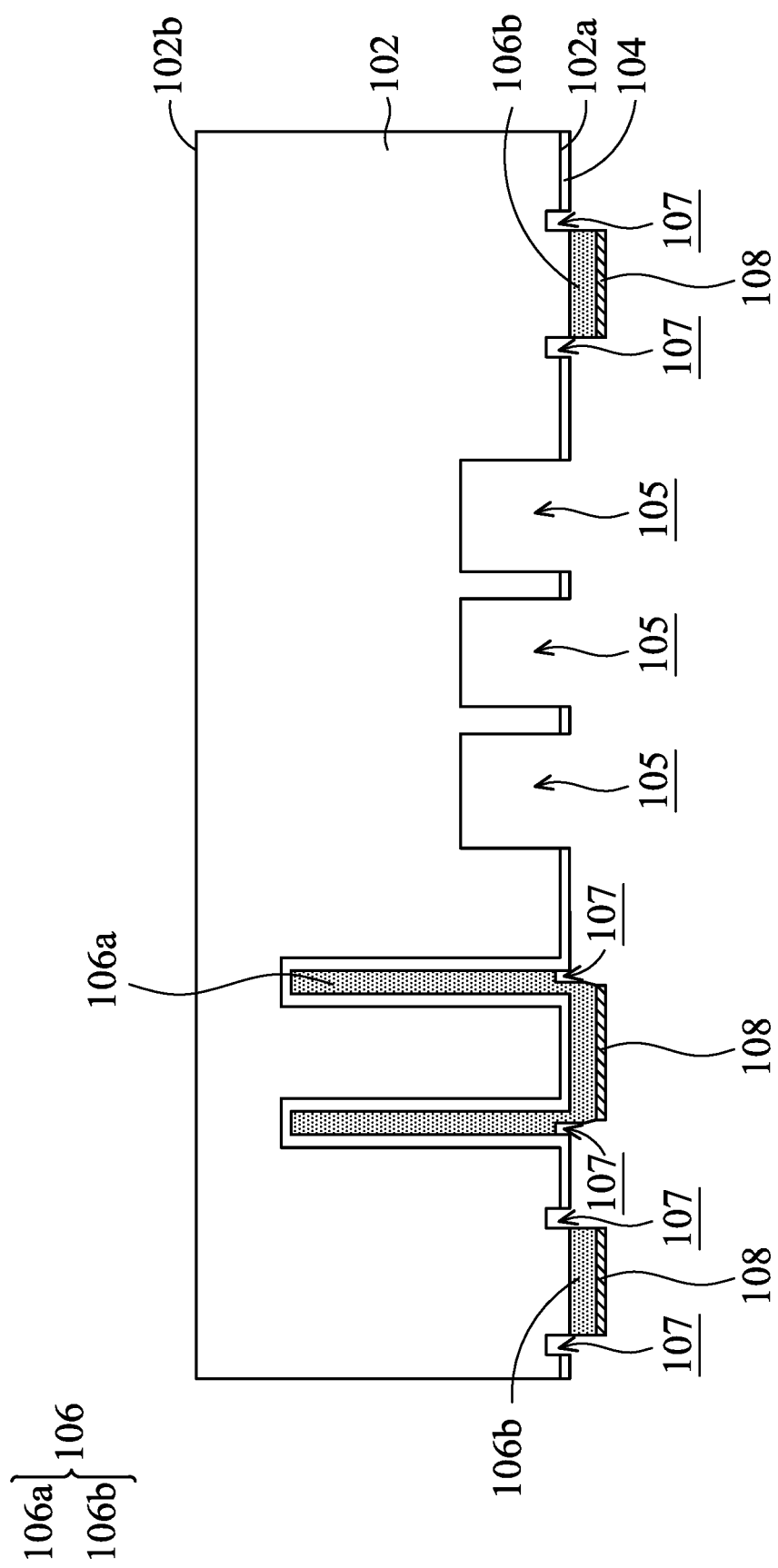

Afterwards, as shown in FIG. 1E, the substrate 102 is reversed, and a portion of substrate 102 and a portion of the isolation layer 104 is removed to form a number of cavities 105 and a number of recesses 107 on the first surface 102b of the substrate 102, in accordance with some embodiments of the disclosure. In some embodiments, the cavities 105 and the recesses 107 are formed by an etching process, such as a dry etching process or a wet etching process. The cavities 105 allow the MEMS substrate 202 to move freely. The recesses 107 next to the polysilicon layer 106 are used to prevent the shorting problem. The depth of each of the cavities 105 is greater than the depth of each of the recesses 107.

Figure 1F:
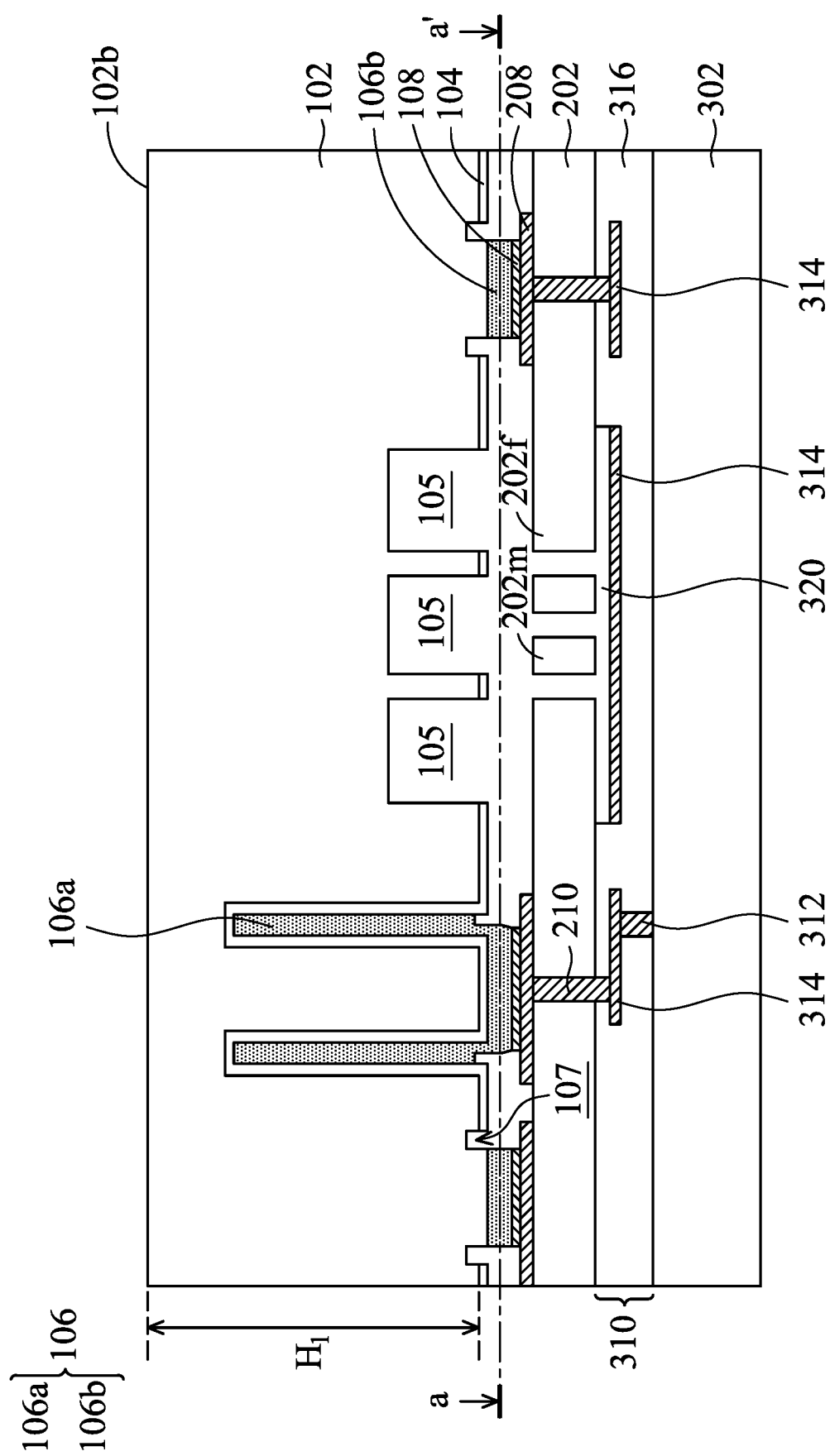

Afterwards, as shown in FIG. 1F, the substrate 102 is bonded to the micro-electro-mechanical system (MEMS) substrate 202, in accordance with some embodiments of the disclosure. The substrate 102 is bonded to the MEMS substrate 202 by bonding the first bonding layer 108 and a second bonding layer 208 over the MEMS substrate 202.

The substrate 102 is configured to provide protection for the MEMS substrate 202. The substrate 102 provides the cavities 105 for the MEMS substrate 202. In some embodiments, the substrate 102 does not include an integrated circuit. In other words, the substrate 102 has no integrated circuits.

The MEMS substrate 202 bonded to a semiconductor substrate 302 is pre-formed. The MEMS substrate 202 may be a silicon wafer including MEMS devices, features and/or functionalities. In some embodiments, the MEMS substrate 202 includes a number of MEMS devices. The MEMS substrate 202 may alternatively or additionally include another elementary semiconductor, such as germanium (Ge). The MEMS substrate 202 may also include a compound semiconductor, such as silicon carbide, gallium arsenic, indium arsenide, indium phosphide, or the like.

The MEMS substrate 202 includes a movable element 202m and a fixed element 202f. The movable element 202m is also called a proof mass. In some embodiments, the movable element 202m is made of silicon-containing material, such as polysilicon, amorphous silicon, or crystalline silicon.

The MEMS substrate 202 has a first surface facing the substrate 102 and a second surface facing the semiconductor substrate 302. The second bonding layer 208 is formed on the first surface of the MEMS substrate 202. In some embodiments, the width of the second bonding layer 208 is greater than the width of the first bonding layer 108. In some embodiments, the sidewall surfaces of the second bonding layer 208 are substantially aligned with the outer sidewall surfaces of the isolation ring which surrounds the semiconductor via 116. A through-silicon-via (TSV) 210 is formed in the MEMS substrate 202 and is electrically connected to the second bonding layer 208.

The second bonding layer 208 includes germanium (Ge), aluminum (Al), copper (Cu), titanium (Ti), nickel (Ni), silver (Ag), gold (Au), indium (In), tin (Sn), silicon (Si) or combinations thereof. The second bonding layer 208 is formed by a chemical vapor deposition (CVD) process, a physical vapor deposition (PVD) process, plating, or another applicable process. The patterns of the second bonding layer 208 are defined by a photolithography process and an etching process. In some embodiments, the second bonding layer 208 is a part of an interconnect structure. The interconnect structure includes conductive features, such as conductive lines, vias, or conductive pads, formed in an insulating material.

As mentioned above, the substrate 102 is bonded to the MEMS substrate 202 by bonding the first bonding layer 108 and the second bonding layer 208 through a eutectic bonding process. The eutectic bonding process is performed with a bonding force at a certain temperature. As a result, the eutectic alloy is formed from the first bonding layer 108 and second bonding layer 208.

The semiconductor substrate 302 includes a semiconductor device, such as an integrated circuit (IC). The IC includes complementary MOSFET (CMOS), a CMOS imaging sensor (CIS), a MEMS, and/or other applicable active and/or passive devices. In some embodiments, the semiconductor substrate 302 includes an IC (or a portion thereof) designed and is formed by a CMOS-based process. The semiconductor substrate 302 including a device formed using other semiconductor fabrication technologies is also within the scope of the described method and present disclosure.

In some embodiments, the semiconductor substrate 302 is a silicon wafer. The semiconductor substrate 302 may alternatively or additionally include another elementary semiconductor, such as germanium (Ge). The semiconductor substrate 302 may also include a compound semiconductor, such as silicon carbide, gallium arsenic, indium arsenide, indium phosphide, or the like.

An interconnect structure 310 is formed over the semiconductor substrate 302. The interconnect structure 310 includes multiple conductive features formed in a dielectric layer 316 (such as inter-metal dielectric, IMD). The conductive features include a conductive via 312, a conductive line 314. The conductive via 312 is electrically connected to the conductive line 314, and the conductive line 314 is electrically connected to the TSV 210.

The dielectric layer 316 includes a single layer or multiple dielectric layers. The dielectric layer 316 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 316 is formed by a chemical vapor deposition (CVD) process, a spin-on process, a sputtering process, or a combination thereof.

In some embodiments, the dielectric layer 316 is made of an extreme low-k (ELK) dielectric material with a dielectric constant (k) less than about 2.5. With geometric size gradually shrinking, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

In some embodiments, each of the conductive features (such as the conductive via 312, or the conductive line 314) is made of metal materials, such as copper (Cu), aluminum (Al), titanium (Ti), tantalum (Ta), nickel (Ni), silver (Ag), gold (Au), indium (In), tin (Sn) or a combination thereof. In some embodiments, the conductive features are formed by electro-plating, electroless plating, sputtering, chemical vapor deposition (CVD) or another applicable process.

The semiconductor substrate 302 is bonded to the MEMS substrate 202 by bonding the dielectric layer 316 of the interconnect structure 310 and the MEMS substrate 202 through a fusion bonding. In some embodiments, the fusion bonding is between Si of the MEMS substrate 202 and silicon dioxide ($SiO_2$) of the dielectric layer 316. After the semiconductor substrate 302 is bonded to the MEMS substrate 202, a trench is formed through the MEMS substrate 202 and extended into the dielectric layer of the interconnect structure 310, and a conductive material is filled into the trench to form the TSV 210. The TSV 210 is electrically connected to the conductive line 314. After the TSV 210 is formed, the substrate 102 is bonded to the micro-electro-mechanical system (MEMS) substrate 202 by bonding the first bonding layer 108 and a second bonding layer 208.

A cavity 320 is formed in the dielectric layer 316 and below the movable element 202m of the MEMS substrate 202. The cavity 320 is used to provide space between the MEMS substrate 202 and the semiconductor substrate 302.

Figure 2A:
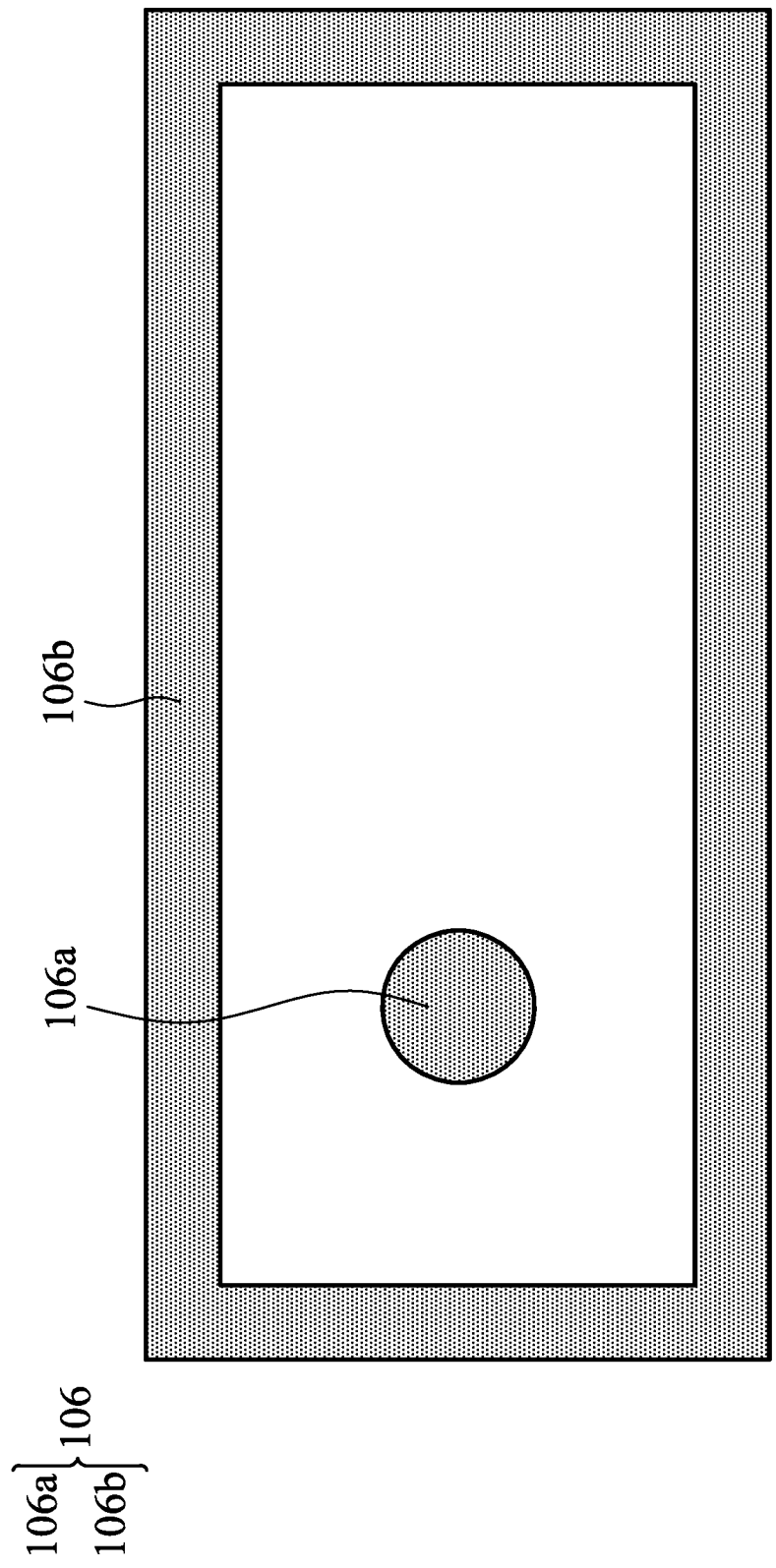
FIG. 2A shows a top-view representation taken along a-a' line of FIG. 1F.

FIG. 2A shows a top-view representation taken along a-a' line of FIG. 1F. As shown in FIG. 2A, the second portion 106b of the polysilicon layer 106 forms a ring-shaped structure to encircle the MEMS device in the MEMS substrate 202. In addition, the top view of the first portion of the polysilicon layer 106 has an ellipse shape. In some other embodiments, the top view of the first portion of the polysilicon layer 106 has a circle, rectangle, square, polygon shape or another applicable shape.

Figure 1G:
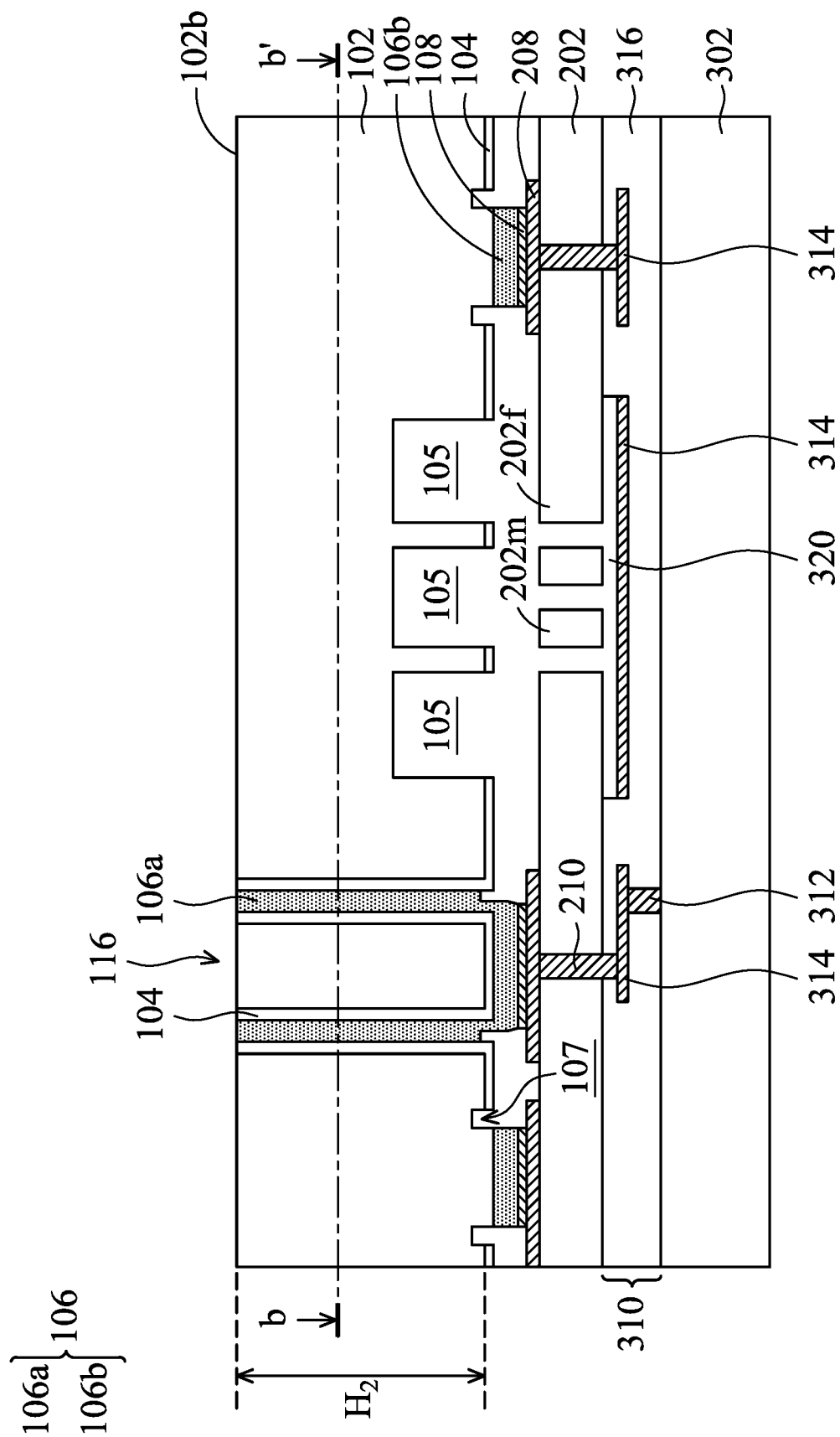
Figure 2B:
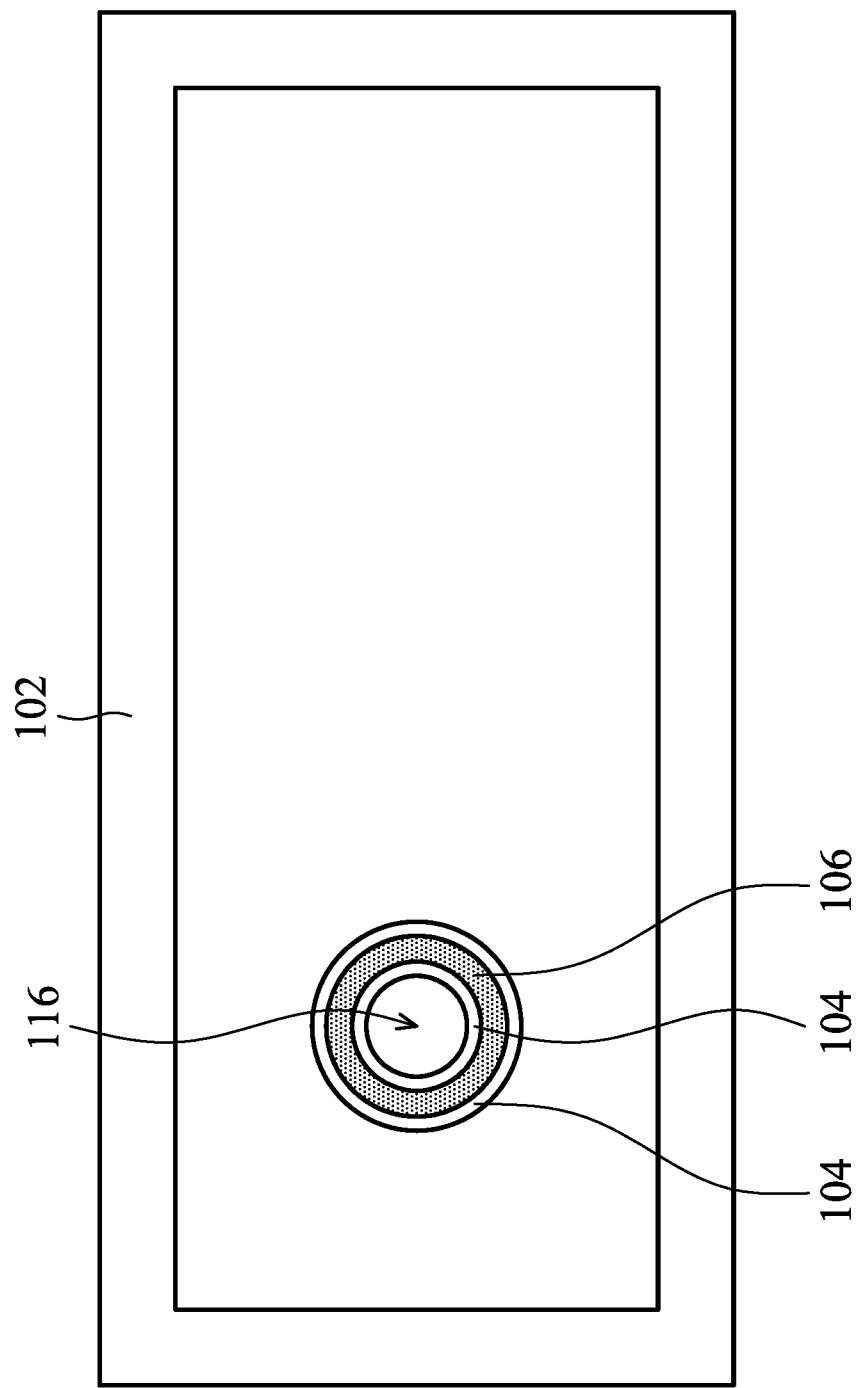
FIG. 2B shows a top-view representation taken along a-a' line of FIG. 1G.

Afterwards, as shown in FIG. 1G, after the substrate 102 is bonded to the MEMS substrate 202 with the semiconductor substrate 202, the substrate 102 is thinned from the second surface 102b of the substrate 102, in accordance with some embodiments of the disclosure. FIG. 2B shows a top-view representation taken along b-b' line of FIG. 1G.

As shown in FIGS. 1G and 2B, the polysilicon layer 106 and the isolation layer 104 are exposed. The polysilicon layer 106 and the isolation layer 104 construct an isolation ring to surround a semiconductor via 116. In other words, a portion of the substrate 102 is surrounded by the isolation ring to form the semiconductor via 116. The semiconductor via 116 is through the substrate 102 and used to connect the other devices.

Figure 1H:
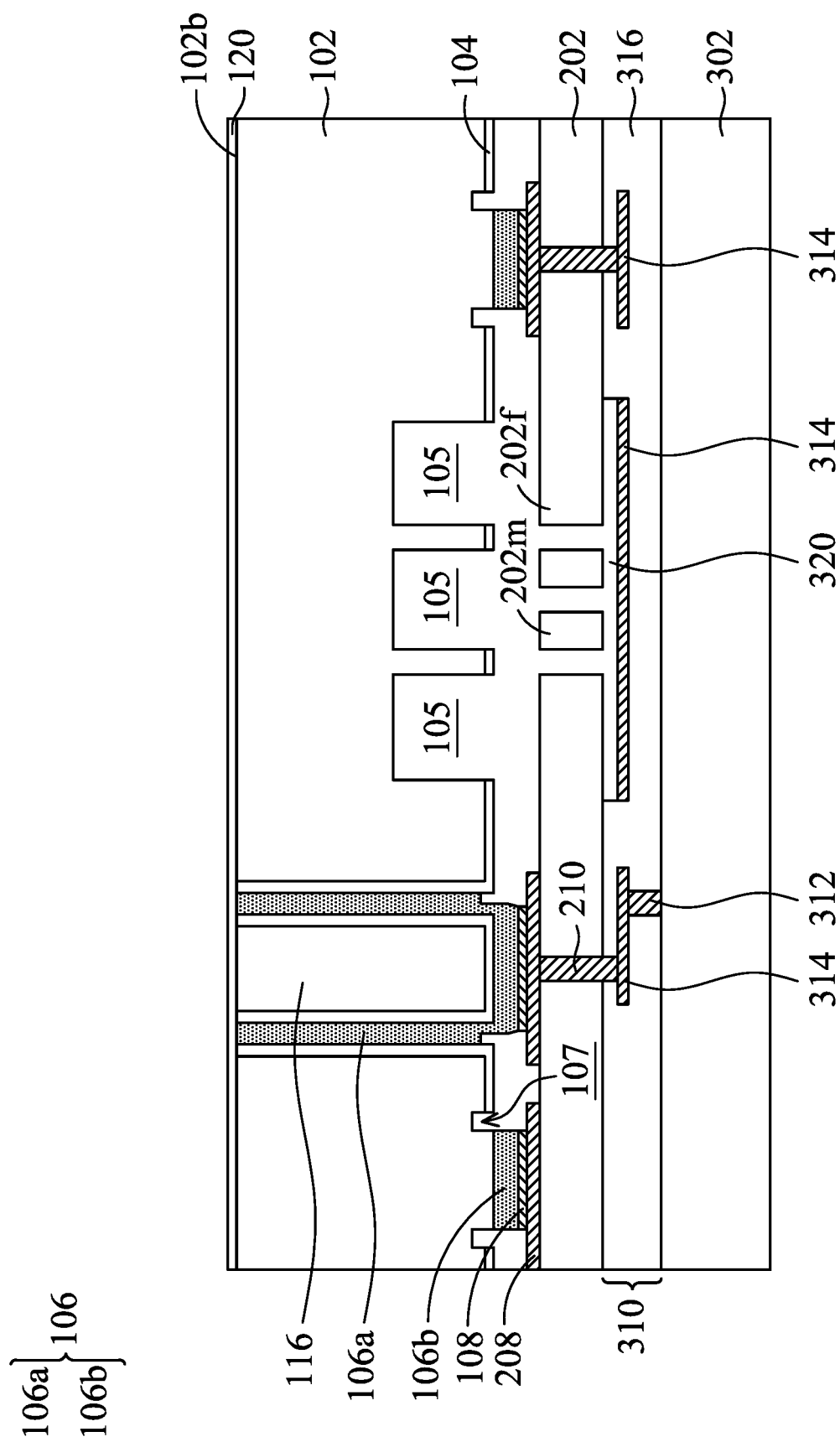
Figure 1I:
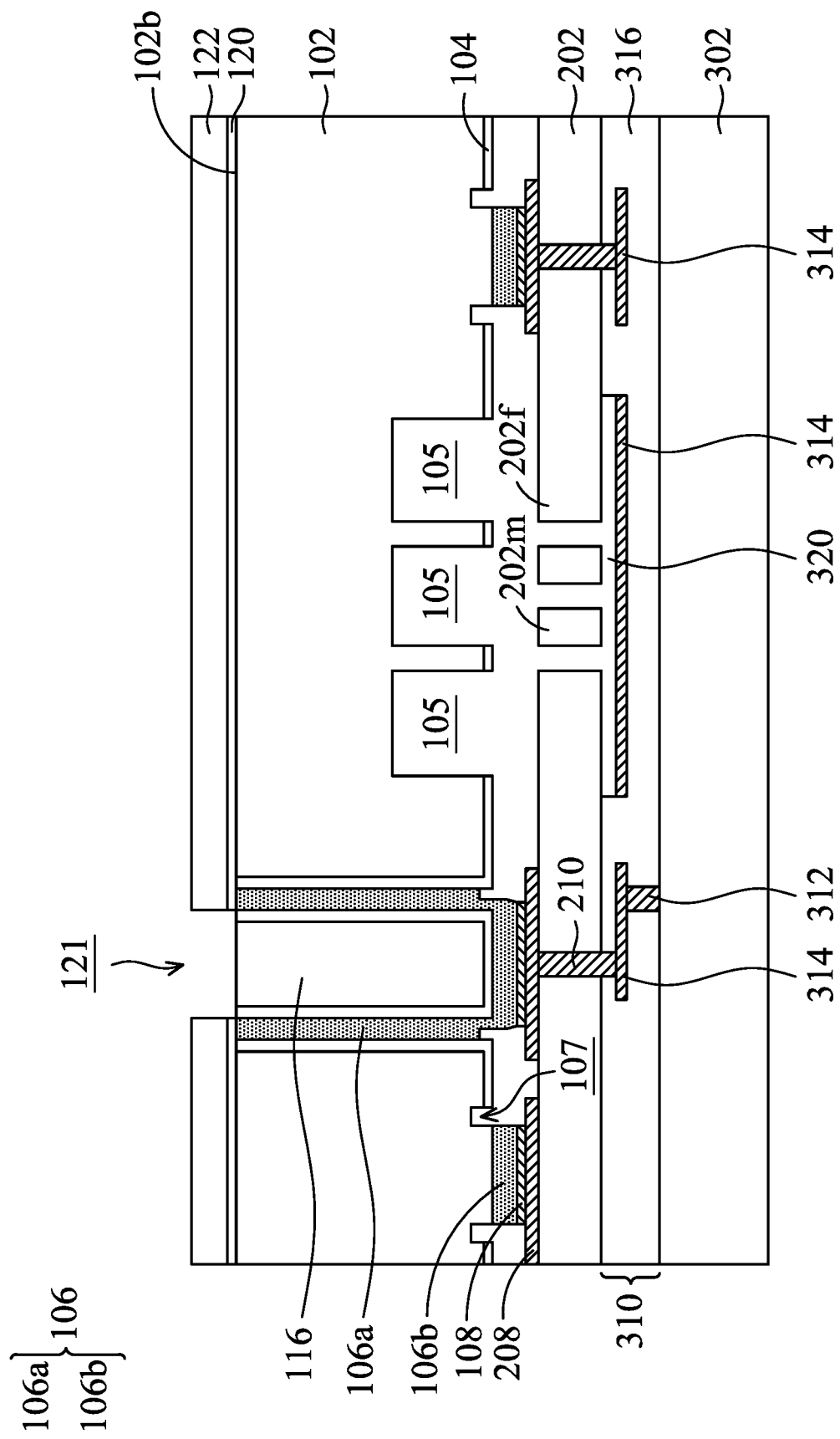
Figure 1J:
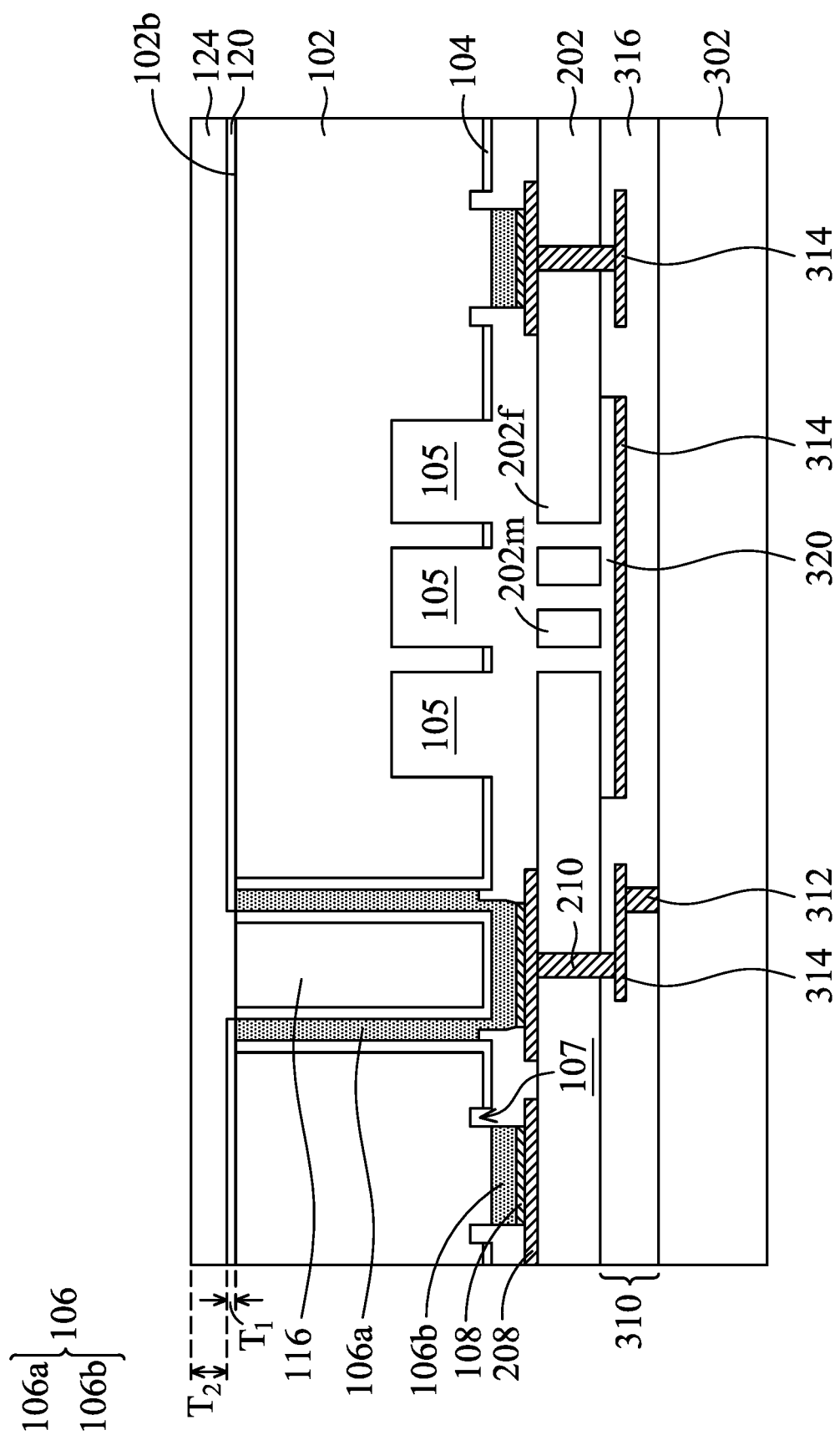
Figure 1K:
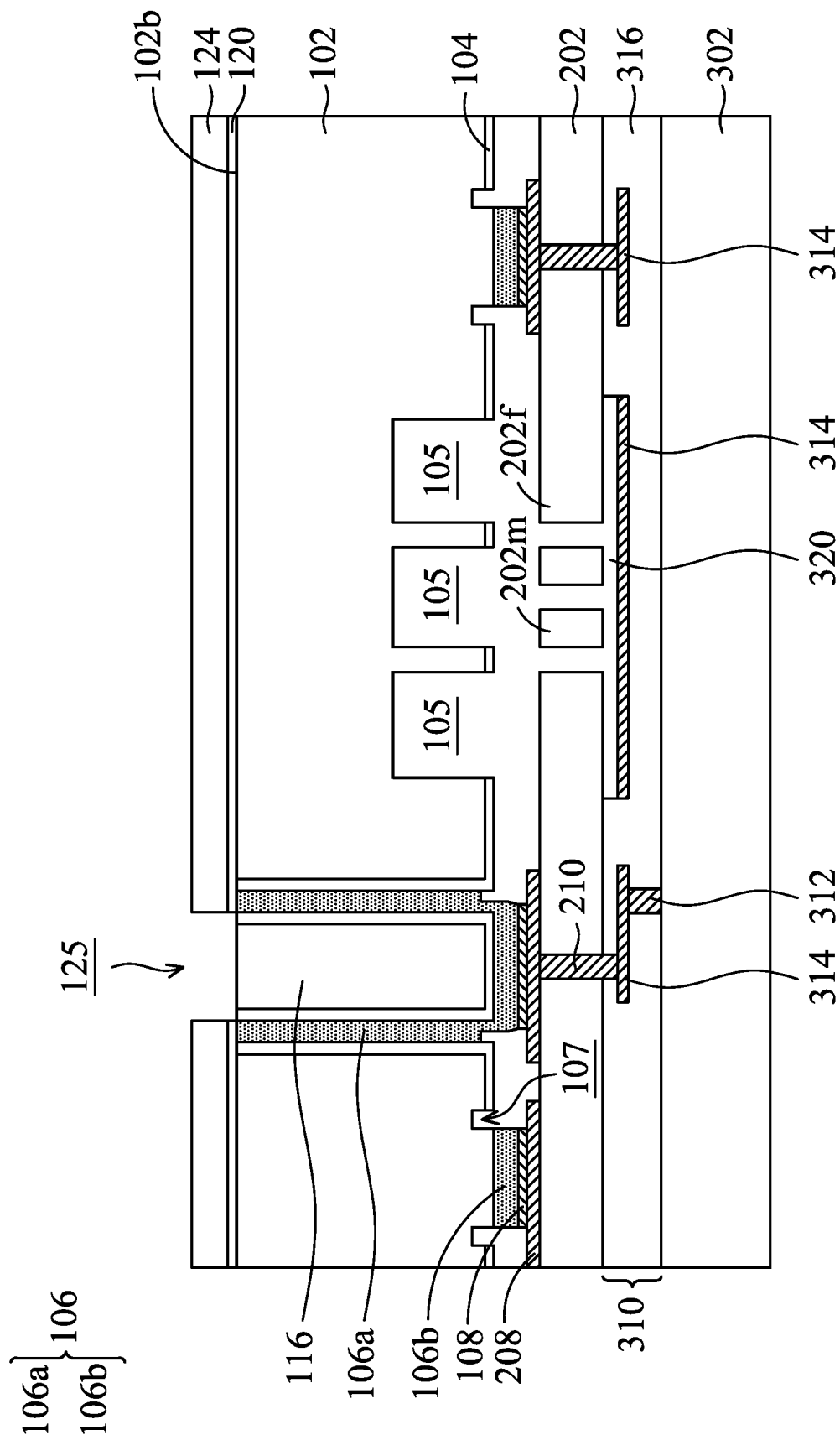
Figure 1L:
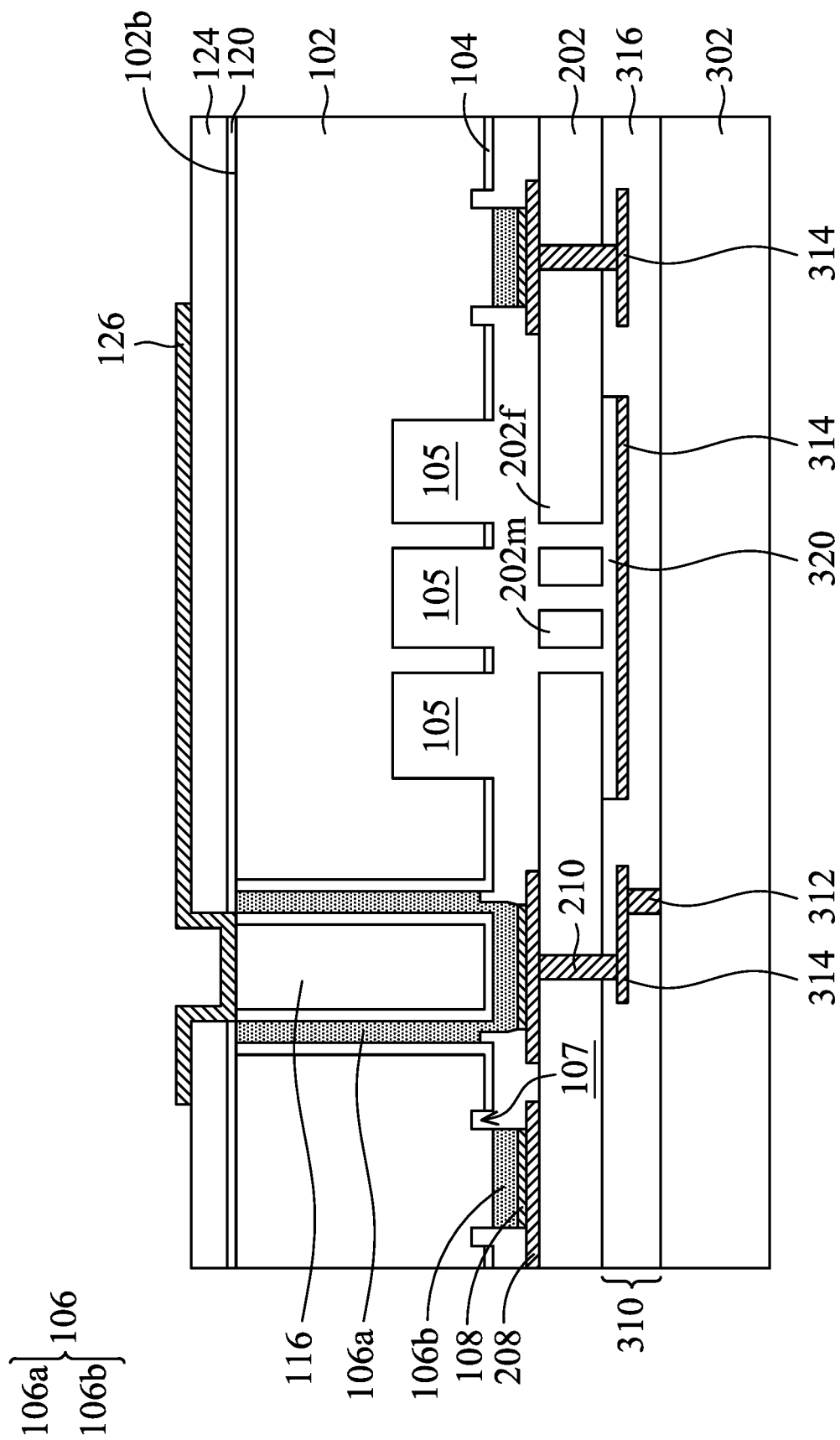

A portion of the first portion 106a of the polysilicon layer 106 which is in direct contact with the semiconductor via 116 is used to electrically connect to the first bonding layer 108 and the conductive layer 126 (shown in FIG. 1L). The first portion 106a of the polysilicon layer 106 surrounds the semiconductor via 116 to form a U-shaped structure. The U-shaped structure includes two arms extends upwardly from a bottom portion. The recesses 107 are formed between each of the arms and the bottom portion.

It should be noted that, in some embodiments, the semiconductor via 116 and the substrate 102 are made of the same material or the substantially the same material, and therefore the coefficient of thermal expansion (CTE) of the semiconductor via 116 is substantially identical to the coefficient of thermal expansion (CTE) of the substrate 102. For example, the substrate 102 is made of silicon (Si), and the semiconductor via 116 is made of silicon (Si). The stress due to the mismatch of the CTE is greatly reduced. Compared with forming a TSV (filled with a metal material) in the substrate, the stress produced in the substrate 102 with the semiconductor via 116 is reduced.

The substrate 102 is thinned from the first height $H_1$ to the second height $H_2$. The second height $H_2$ is smaller than the first height $H_1$. In some embodiments, the substrate 102 is thinned by a chemical polishing (CMP) process.

Next, as shown in FIG. 1H, a dielectric layer 120 is formed on the second surface 102b of the substrate 102, the semiconductor via 116 and the isolation ring, in accordance with some embodiments of the disclosure. The dielectric layer 120 prevents the external gases and moisture from diffusing from the environment to the cavities 205.

The dielectric layer 120 may be a single layer or multiple layers. In some embodiments, the dielectric layer 120 is made of silicon nitride, silicon oxynitride, silicon carbide, silicon oxycarbide, silicon carbon nitride or a combination thereof.

Afterwards, as shown in FIG. 1I, a photoresist layer 122 is formed over the dielectric layer 120, in accordance with some embodiments of the disclosure. Next, the photoresist layer 122 is patterned to form a patterned photoresist layer 122. The dielectric layer 120 is patterned by using the patterned photoresist layer 122 as a mask. As a result, an opening 121 is formed in the dielectric layer 120.

Afterwards, as shown in FIG. 1.1, the patterned photoresist layer 122 is removed, and then a polymer layer 124 is formed in the opening 121 and on the dielectric layer 120, in accordance with some embodiments of the disclosure. The polymer layer 124 is used to provide a buffering and/or cushioning function to reduce the stress caused by the electrical connector 132 (shown in FIG. 1M).

In some embodiments, the polymer layer 124 is made of poly-p-phenylenebenzobisthiazole (PBO), a polyimide (PI), another applicable material or a combination thereof. In some embodiments, the polymer layer 124 is formed by a deposition process, such as a chemical vapor deposition process (CVD), a physical vapor deposition process (PVD), another applicable process, or a combination thereof.

The dielectric layer 120 has a thickness $T_1$, and the polymer layer 124 has a second thickness $T_2$. In some embodiments, the first thickness $T_1$ of the dielectric layer 120 is in a range from about 0.5 μm to about 5 μm. In some embodiments, the second thickness $T_2$ of the polymer layer 124 is in a range from about 1 μm to about 20 μm. It should be noted that if the second thickness $T_2$ of the polymer layer 124 is smaller than 1 μm, the buffer function is not good enough to prevent the conductive layer 126 from peeling. If the second thickness $T_2$ of the polymer layer 124 is greater than 20 μm, the high overall thickness of the package structure over the substrate 102 may occupy too much area. In some embodiments, the ratio ($T_2/T_1$) of the second thickness $T_2$ to the first thickness $T_1$ is in a range from about 4 to about 40. When the ratio is in the above-mentioned range, the stress can be effectively reduced.

Next, as shown in FIG. 1K, the polymer layer 124 is patterned to form a recess 125, in accordance with some embodiments of the disclosure. The semiconductor via 116 is exposed by the recess 125.

Afterwards, as shown in FIG. 1L, a conductive layer 126 is formed in the recess 125 and over the polymer layer 124, in accordance with some embodiments of the disclosure. Next, the conductive layer 126 is patterned, and it is in direct contact with the semiconductor via 116. In addition, the conductive layer 126 is in direct contact with a portion of the isolation layer 104. In some embodiments, the conductive layer 126 is in direct contact with a portion of the polysilicon layer 106. In some other embodiments, the conductive layer 126 is not in direct contact with a portion of the polysilicon layer 106.

The conductive layer 126 is known as redistribution lines (RDL). The conductive layer 126 is conformally formed in the recess 125 and over the polymer layer 124, and therefore the recess 125 is not completely filled with the conductive layer 126. The conductive layer 126 has a U-shaped structure.

In some embodiments, the conductive layer 126 is made of metal materials, such as copper (Cu), copper alloy, aluminum (Al), aluminum alloy, tungsten (W), tungsten alloy, titanium (Ti), titanium alloy, tantalum (Ta), or tantalum alloy. In some embodiments, the conductive layer 126 is formed by an electro-plating, electroless plating, sputtering, chemical vapor deposition (CVD) or another applicable process.

Figure 1M:
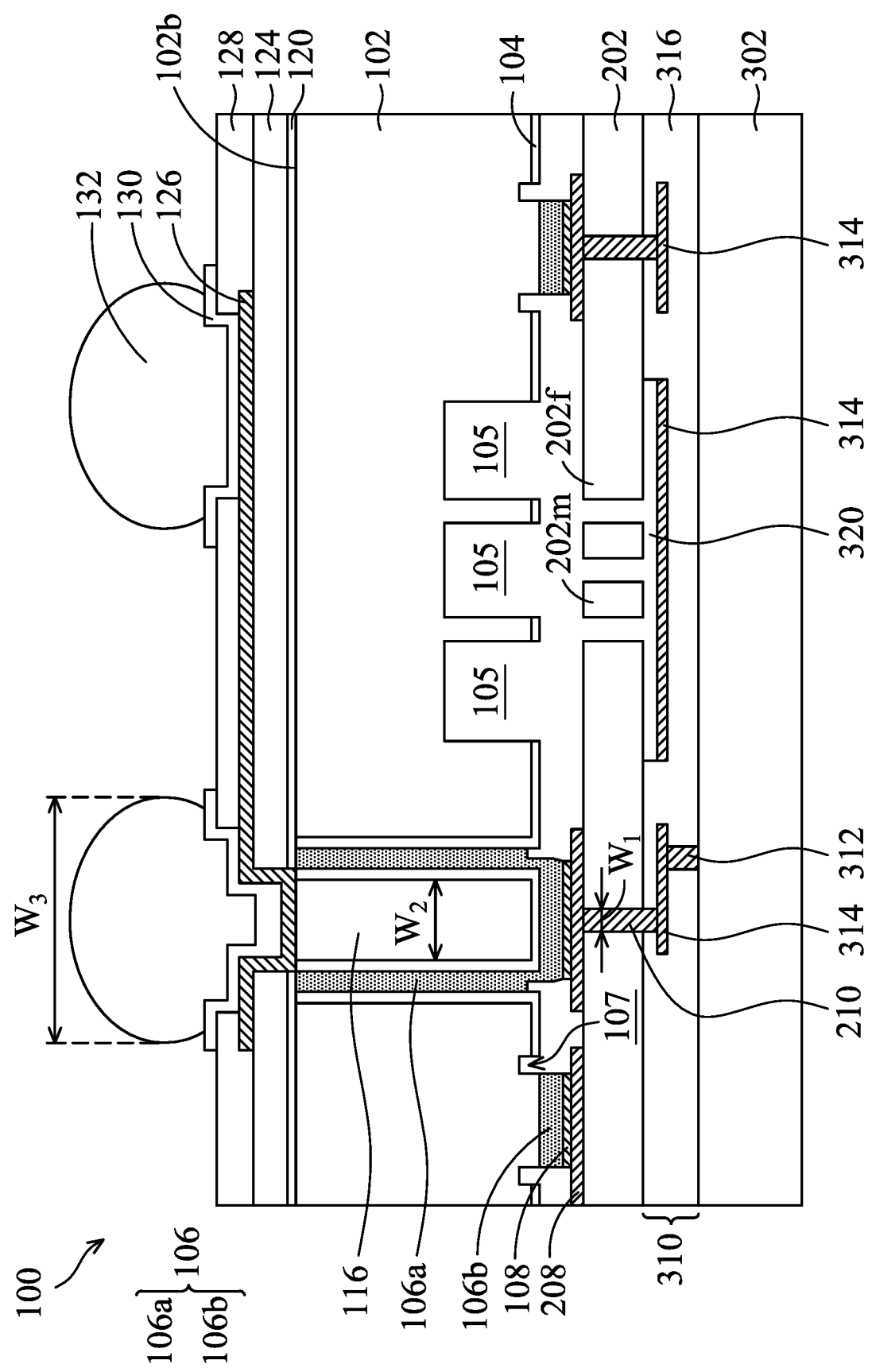

Next, as shown in FIG. 1M, a passivation layer 128 is formed over the conductive layer 126 and the polymer layer 124, in accordance with some embodiments of the disclosure. An under bump metallurgy (UBM) layer 130 is formed in the passivation layer 128, and an electrical connector 132 is formed on the UBM layer 130. The electrical connector 132 is electrically connected to the conductive layer 126 by the UBM layer 130. The electrical connector 132 is electrically connected to the semiconductor via 116 through the conductive layer 126 and the UBM layer 130. In some embodiments, the electrical connector 132 is directly above the semiconductor via 116, and the RC delay is reduced since the distance between the semiconductor via 116 and the electrical connector 132 is short. In some other embodiments, the electrical connector 132 is far away from the semiconductor via 116.

The passivation layer 128 and the polymer layer 124 are made of different materials. In some embodiments, the passivation layer 128 is made of silicon oxide, silicon nitride, silicon oxynitride, or a combination thereof. In some embodiments, the passivation layer 128 is formed by a chemical vapor deposition (CVD) process, a spin-on process, a sputtering process, or a combination thereof.

In some embodiments, the UBM layer 130 is made of titanium (Ti), titanium nitride (TiN), tantalum nitride (TaN), tantalum (Ta), or the like. In some embodiments, the UBM layer 130 further includes a seed layer. The electrical connector 132 is made of conductive materials with low resistivity, such as solder or solder alloy. Exemplary elements included in the solder alloy include Sn, Pb, Ag, Cu, Ni, Bi or combinations thereof. In some embodiments, the UBM layer 130 and the electrical connector 132 independently formed by electro-plating, electroless plating, sputtering, chemical vapor deposition (CVD) or another applicable process.

After forming the electrical connector 132, a ball shear test is applied to evaluate the reliability of the electrical connector 132. During the ball shear test, the electrical connector 132 is pushed by the shear arm, and then the electrical connector 132 will be peeling from the original position. However, if there is no polymer layer between the dielectric layer 120 and the conductive layer 126, the dielectric layer 120 is not robust enough to prevent peeling. In addition, the adhesion between the conductive layer 126 and the dielectric layer 120 is so poor that the conductive layer 126 may peel slightly from the surface of the dielectric layer 120 during the ball shear test. The polymer layer 124 between the conductive layer 126 and the dielectric layer 120 is used to provide a buffering or cushioning function, so that it prevents the dielectric layer 120 from peeling to improve the reliability of the MEMS device structure 100. In addition, the polymer layer 124 can improve adhesion between the conductive layer 126 and the dielectric layer 120.

Furthermore, the electrical connector 132 is formed on the substrate 102, not on the bottom surface of the semiconductor substrate 302, and the stress caused by the electrical connector 132 is far away from the IC devices in the semiconductor substrate 302. Therefore, the IC devices in the semiconductor substrate 302 will not be interfered with by the electrical connector 132.

The TSV 210 formed in the MEMS substrate 202 has a first width $W_1$ along the horizontal direction. In some embodiments, the first width $W_1$ of the TSV 210 is in a range from about 0.5 μm to about 10 μm. The semiconductor via 116 has a second width $W_2$ which is measured from a right inner sidewall surface of the oxidation layer 104 to a left sidewall surface of the oxidation layer 104 along the horizontal direction. In some embodiments, the second width $W_2$ of the semiconductor via 116 is in a range from about 20 μm to about 150 μm. The electrical connector 132 has a third width $W_3$ along the horizontal direction. In some embodiments, the third width $W_3$ of the electrical connector 132 is in a range from about 100 μm to about 400 μm. The third width $W_3$ is greater than the second width $W_2$, and the second width $W_2$ is greater than the first width $W_1$.

It should be noted that the dielectric layer 120 provides a protective function to prevent external gases and moisture from diffusing from the environment to the cavities 205 above the MEMS substrate 202. The polymer layer 124 provides a buffering and adhesion function to prevent failure of the ball shear test. By combining the individual advantage of the dielectric layer 120 and the polymer layer 124, the reliability of the MEMS device structure 100 can be improved.

FIGS. 3A-3E show cross-sectional representations of various stages of forming a micro-electro-mechanical system (MEMS) device structure 200, in accordance with some embodiments of the disclosure. Some processes and materials used to form the MEMS device structure 200 are similar to, or the same as, those used to form the MEMS device structure 100 and are not repeated herein.

Figure 3A:
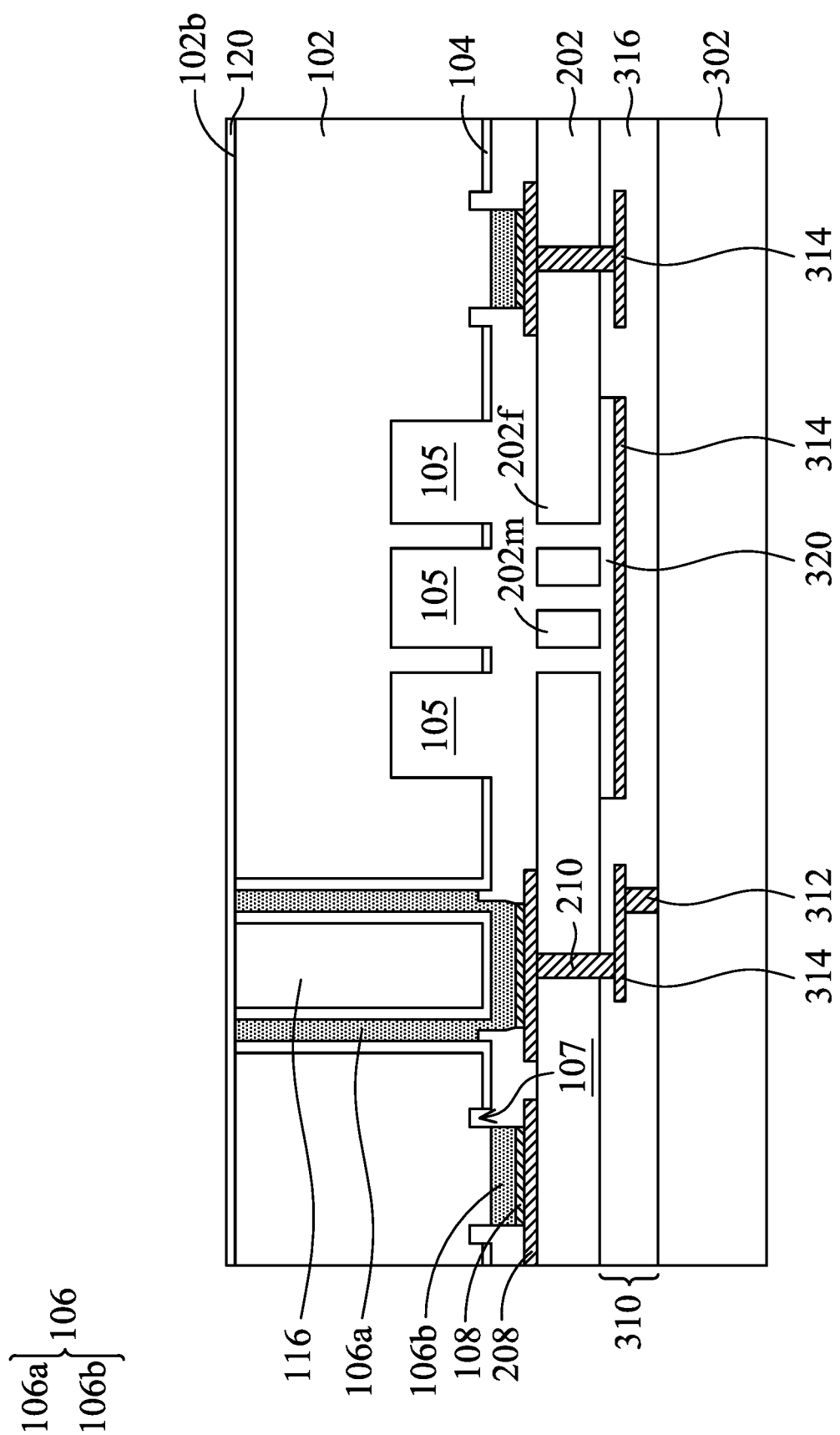
FIGS. 3A-3E show cross-sectional representations of various stages of forming a micro-electro-mechanical system (MEMS) device structure, in accordance with some embodiments of the disclosure.

As shown in FIG. 3A, similar to FIG. 1H, the dielectric layer 120 is formed on the second surface 102b of the substrate 102, the semiconductor via 116 and the isolation ring, in accordance with some embodiments of the disclosure.

Figure 3B:
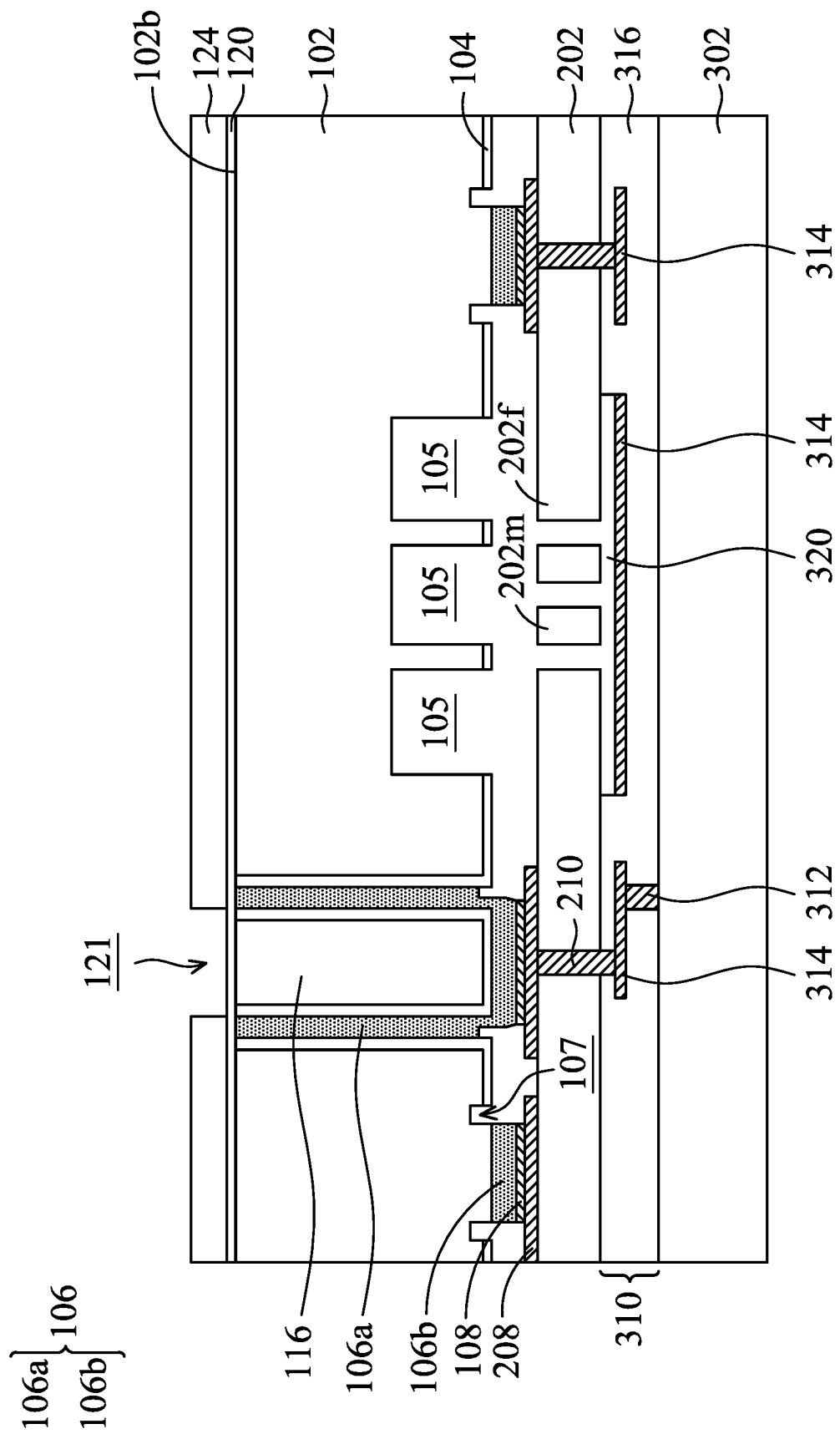

Afterwards, as shown in FIG. 3B, the polymer layer 124 is formed over the dielectric layer 120, in accordance with some embodiments of the disclosure. Next, the polymer layer 124 is patterned by a photolithography process to form a patterned polymer layer 124 with the opening 121. In some embodiments, the polymer layer 124 may be a positive or negative photoresist layer. The polymer layer 124 is exposed by a light and then developed by a developer to form the patterned polymer layer 124.

Figure 3C:
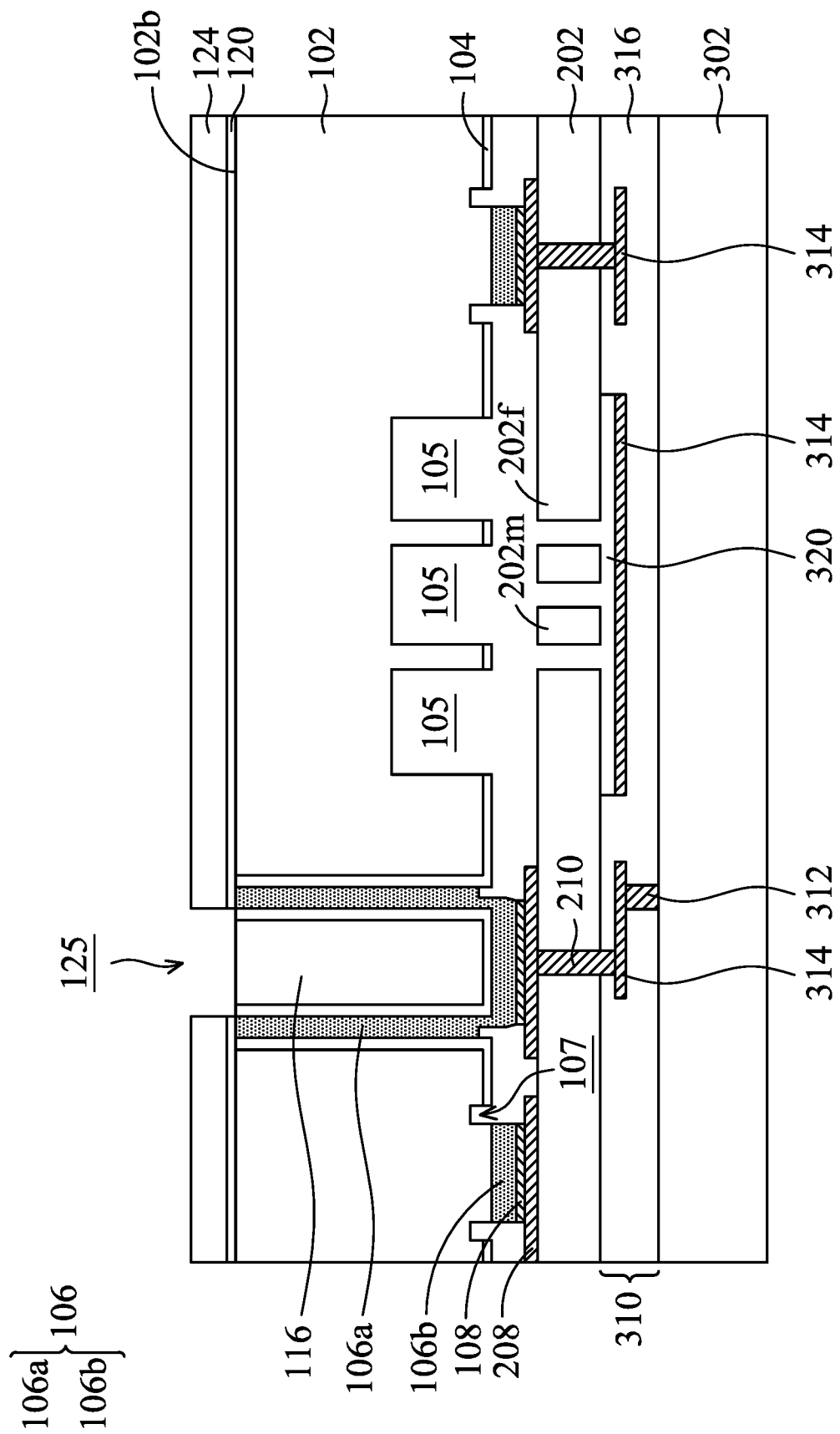

Next, as shown in FIG. 3C, a portion of the dielectric layer 120 is removed by using the patterned polymer layer 124 as a mask, in accordance with some embodiments of the disclosure. The dielectric layer 120 is patterned to form the recess 125. The semiconductor via 116 is exposed by the recess 125.

Figure 3D:
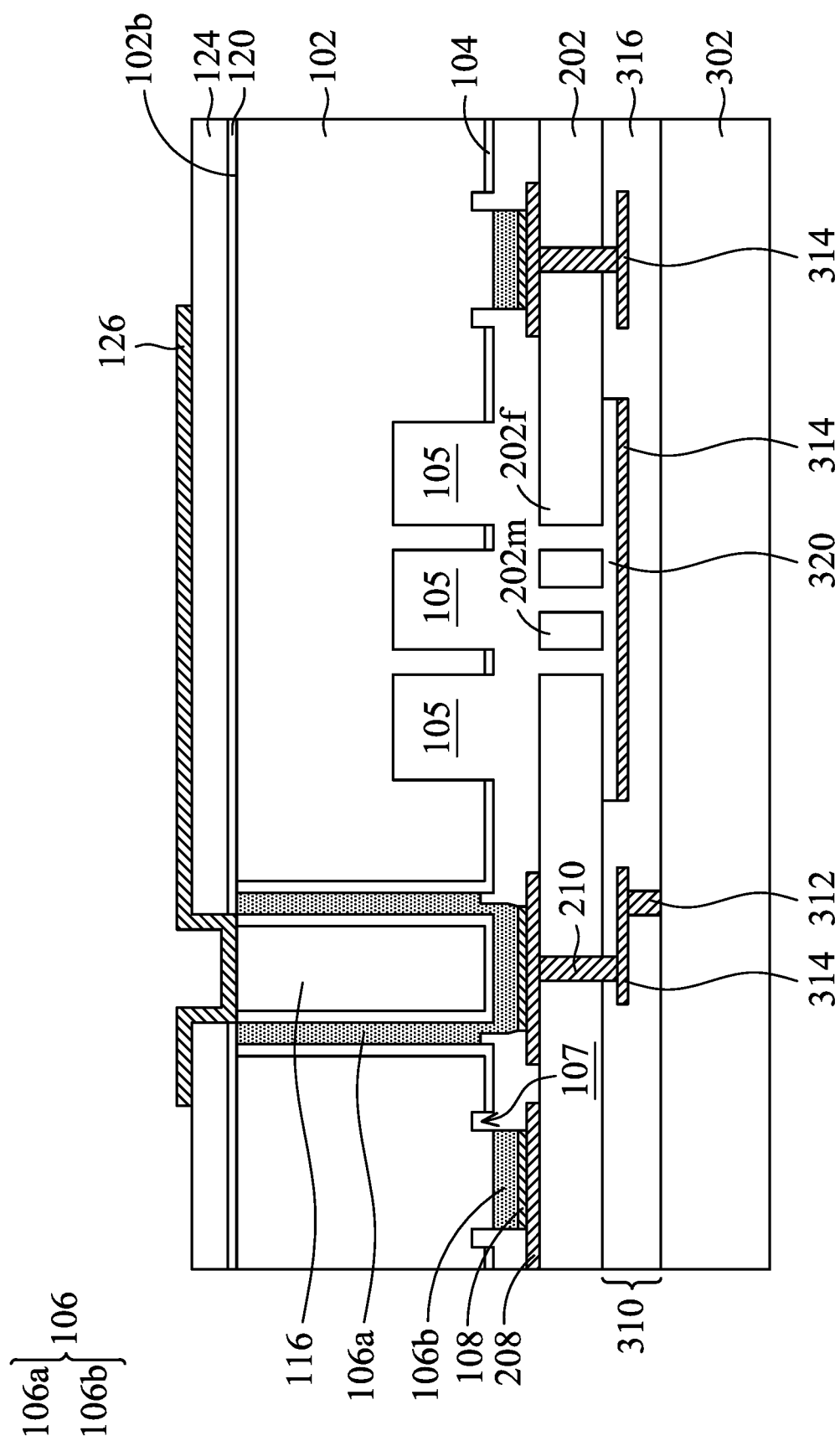

Afterwards, as shown in FIG. 3D, the conductive layer 126 is formed in the recess 125 and over the polymer layer 124, in accordance with some embodiments of the disclosure. Next, the conductive layer 126 is patterned, and it is in direct contact with the semiconductor via 116. In addition, the conductive layer 126 is in direct contact with a portion of the isolation layer 104.

Figure 3E:
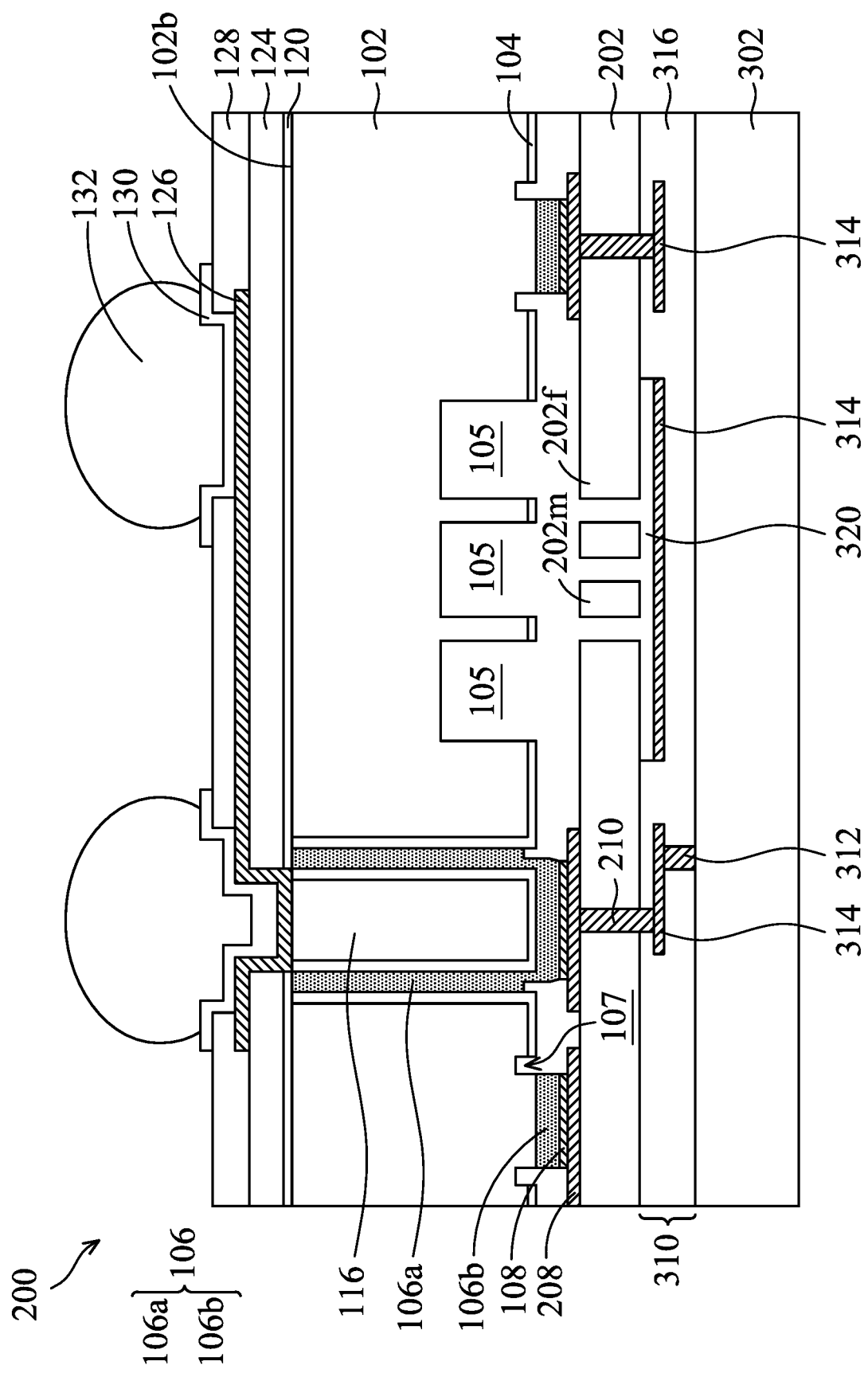

Next, as shown in FIG. 3E, the passivation layer 128 is formed over the conductive layer 126 and the polymer layer 124, in accordance with some embodiments of the disclosure. The UBM layer 130 is formed in the passivation layer 128, and the electrical connector 132 is formed on the UBM layer 130. The electrical connector 132 is electrically connected to the semiconductor via 116 through the conductive layer 126 and the UBM layer 130. In some embodiments, the electrical connector 132 is directly above the semiconductor via 116.

Compared with the fabrication processes shown in FIGS. 1A-1M, the PR layer is not used in FIGS. 3A-3E, and therefore fabrication time and cost are reduced.

FIGS. 4A-4F show cross-sectional representations of various stages of forming a micro-electro-mechanical system (MEMS) device structure 300, in accordance with some embodiments of the disclosure. Some processes and materials used to form the MEMS device structure 300 are similar to, or the same as, those used to form the MEMS device structure 100 and are not repeated herein.

Figure 4A:
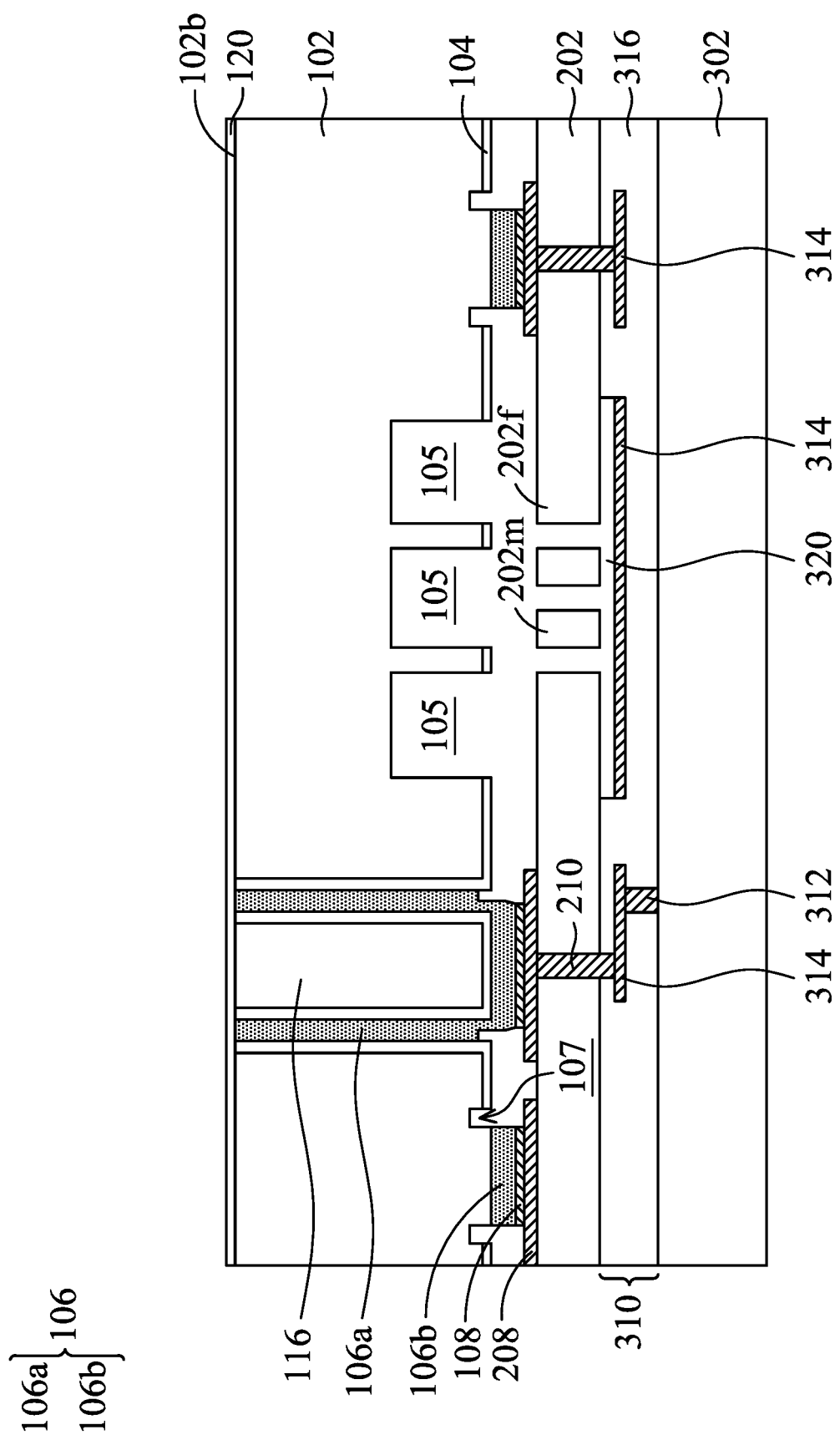
FIGS. 4A-4F show cross-sectional representations of various stages of forming a micro-electro-mechanical system (MEMS) device structure, in accordance with some embodiments of the disclosure.

As shown in FIG. 4A, similar to FIG. 1H, the dielectric layer 120 is formed on the second surface 102b of the substrate 102, the semiconductor via 116 and the isolation ring, in accordance with some embodiments of the disclosure.

Figure 4B:
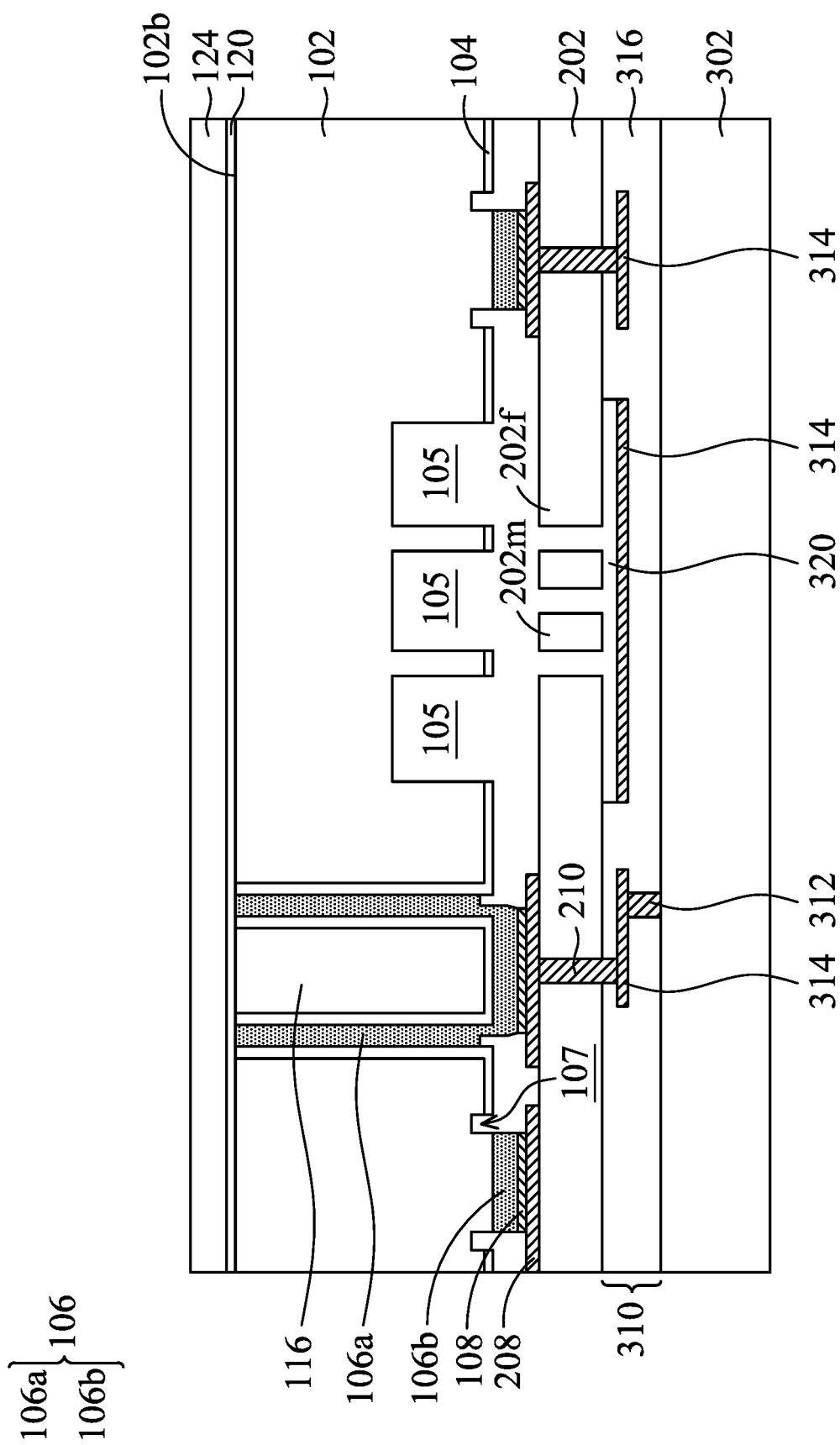

Afterwards, as shown in FIG. 4B, the polymer layer 124 is formed over the dielectric layer 120, in accordance with some embodiments of the disclosure.

Figure 4C:
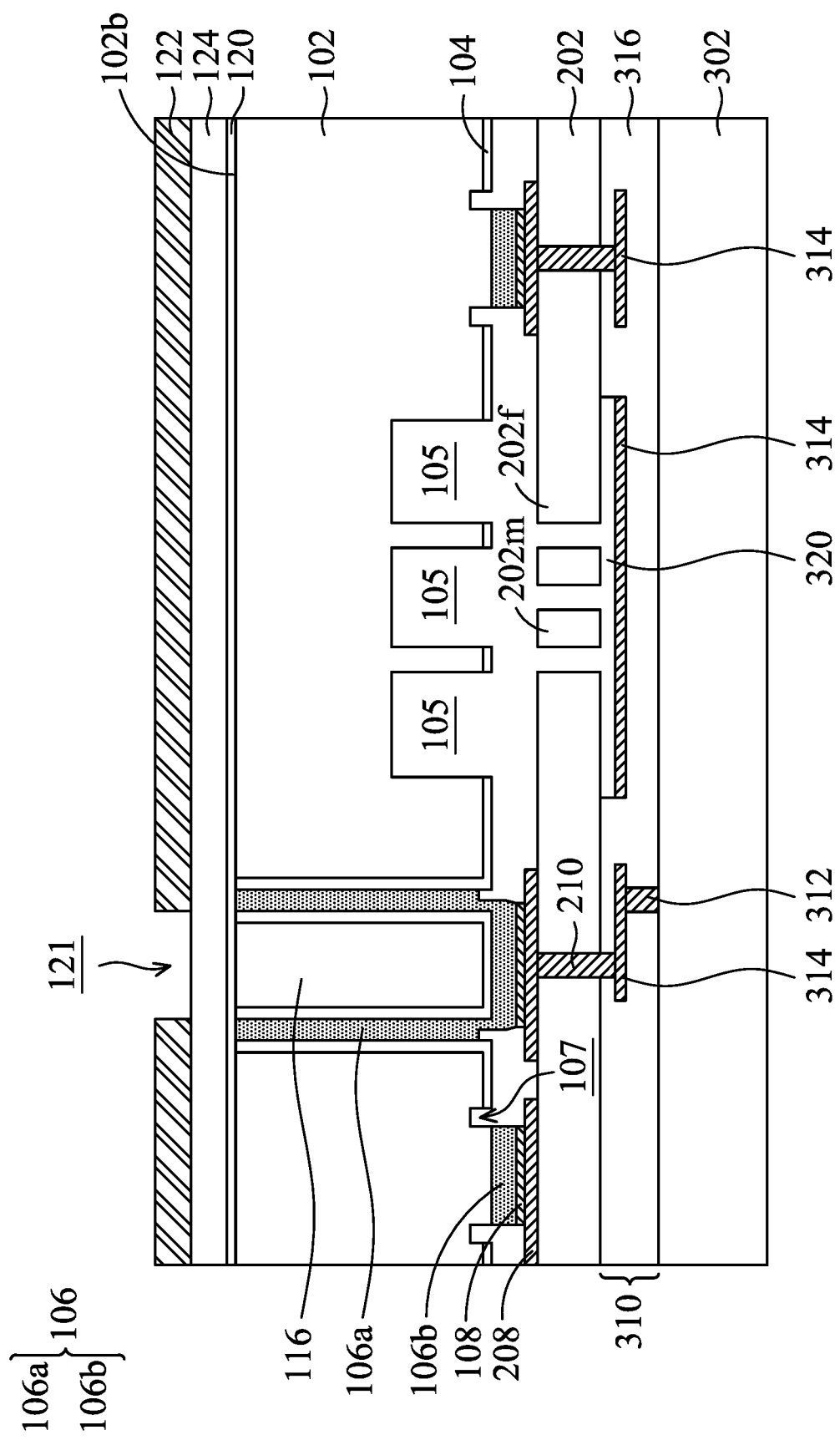

Next, as shown in FIG. 4C, the photoresist layer 122 is formed over the polymer layer 124, in accordance with some embodiments of the disclosure. Next, the photoresist layer 122 is patterned to form a patterned photoresist layer 122 with the opening 121.

Figure 4D:
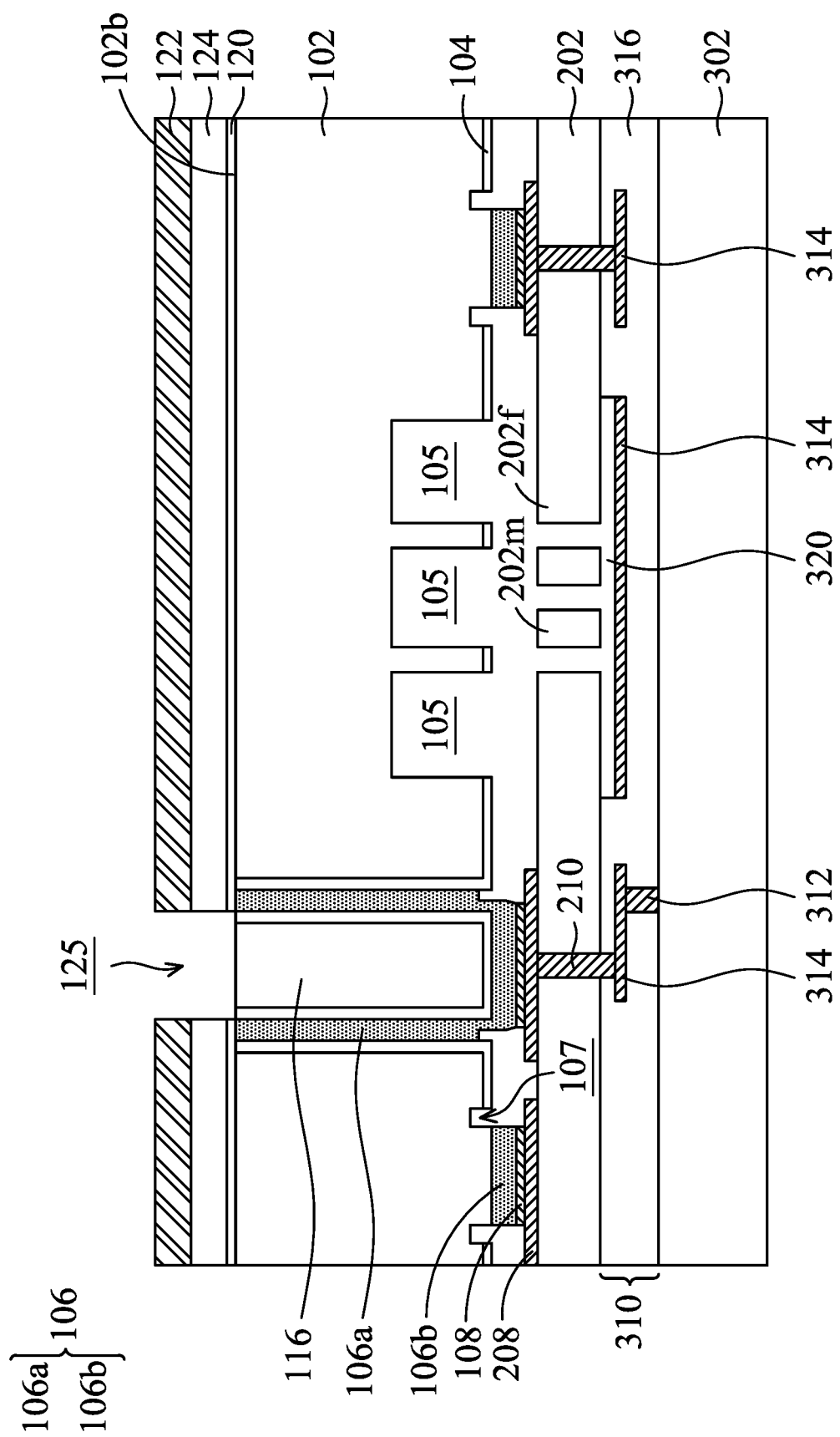

Afterwards, as shown in FIG. 4D, the polymer layer 124 is patterned by using the patterned photoresist layer 122 as a mask, in accordance with some embodiments of the disclosure. Next, the dielectric layer 120 is patterned by using the patterned polymer layer 124 as a mask. As a result, the semiconductor via 116 is exposed by the recess 125.

Figure 4E:
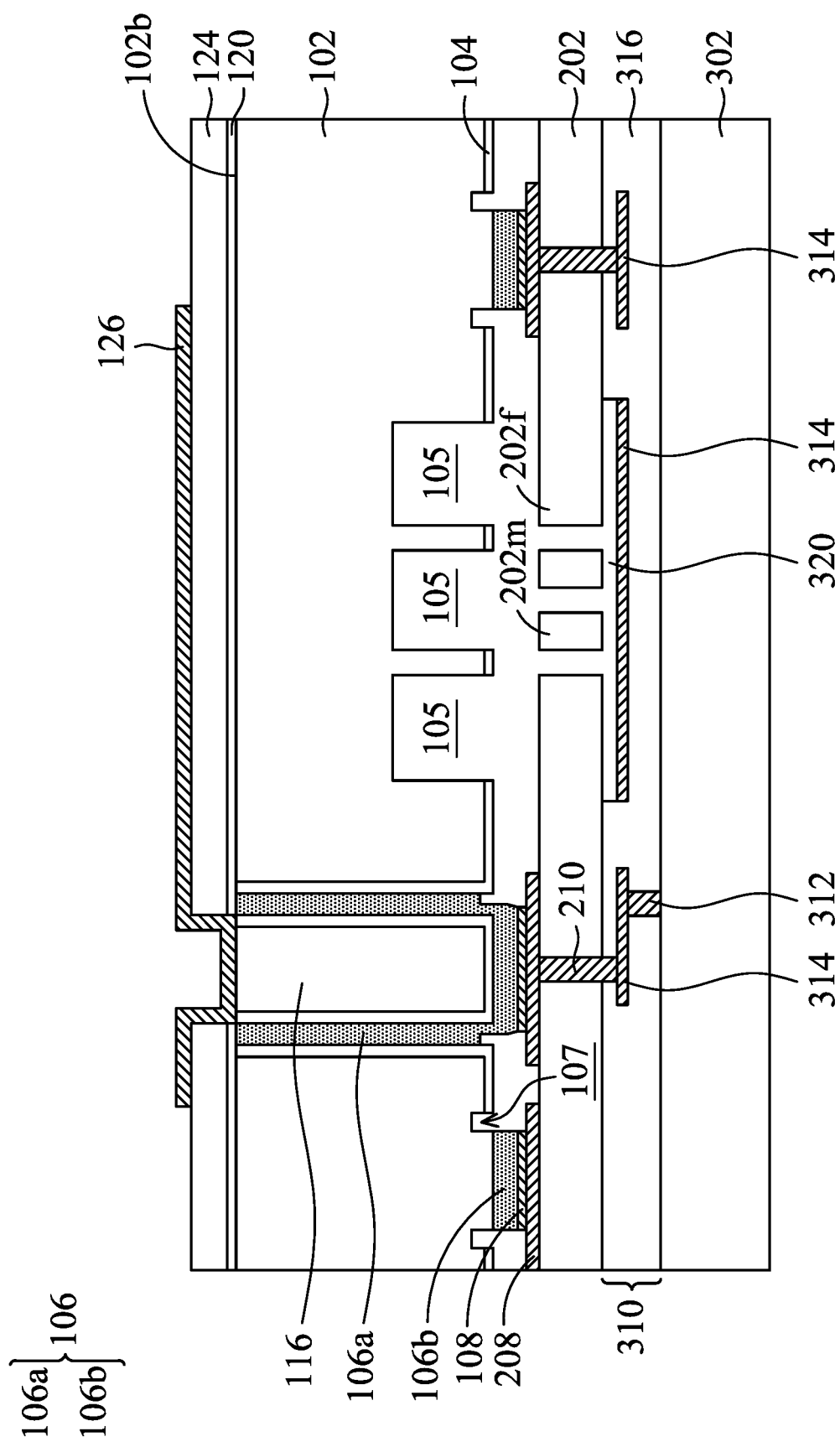

Next, as shown in FIG. 4E, the patterned photoresist layer 122 is removed, and then the conductive layer 126 is formed in the recess 125 and over the polymer layer 124, in accordance with some embodiments of the disclosure. Next, the conductive layer 126 is patterned, and it is in direct contact with the semiconductor via 116. In addition, the conductive layer 126 is in direct contact with a portion of the isolation layer 104.

Figure 4F:
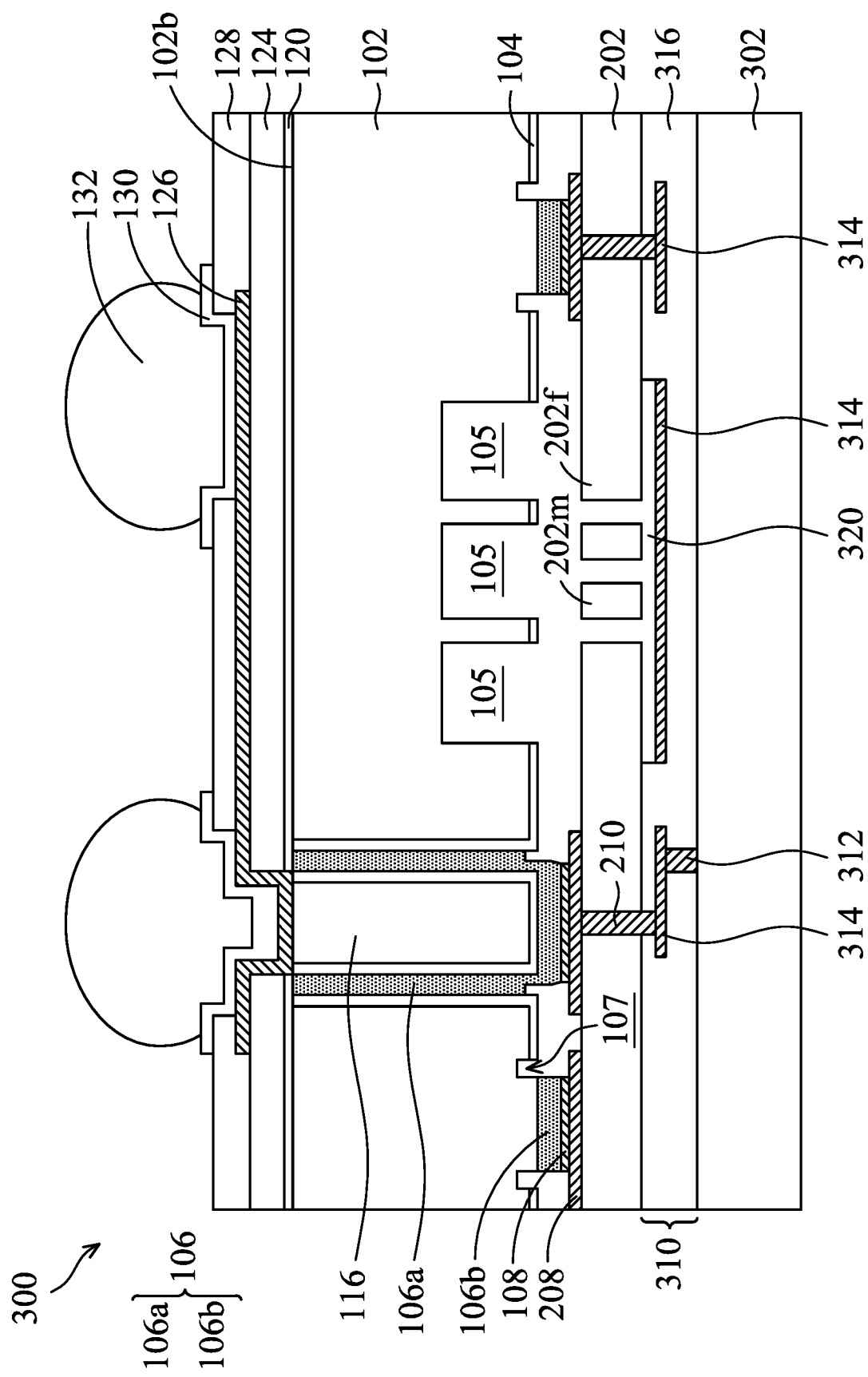

Next, as shown in FIG. 4F, the passivation layer 128 is formed over the conductive layer 126 and the polymer layer 124, in accordance with some embodiments of the disclosure. The UBM layer 130 is formed in the passivation layer 128, and the electrical connector 132 is formed on the UBM layer 130. The electrical connector 132 is electrically connected to the semiconductor via 116 through the conductive layer 126 and the UBM layer 130. In some embodiments, the electrical connector 132 is directly above the semiconductor via 116.

Embodiments for forming a micro-electro-mechanical system (MEMS) device structure are provided. A cap substrate is formed over a MEMS substrate, and the cap substrate includes a semiconductor via. A dielectric layer is formed over the cap substrate and a polymer layer is formed over the dielectric layer. A conductive layer is formed in the dielectric layer and the polymer layer, and a UBM layer is formed over the conductive layer. An electrical connector is formed over the UBM layer. The electrical connector is electrically connected to the semiconductor via the UBM layer and the conductive layer. The polymer layer provides a buffering and/or cushioning function to reduce the stress caused by the electrical connector. In addition, the polymer layer between the dielectric layer and conductive layer prevents the dielectric layer from peeling, improving the reliability of the MEMS device structure. Therefore, the performance of the MEMS device structure is improved.

In some embodiments, a method forming an micro-electro-mechanical system (MEMS) device structure is provided. The method includes forming a substrate over a micro-electro-mechanical system (MEMS) substrate. The substrate includes a semiconductor via. The method also includes forming a dielectric layer over a top surface of the substrate, and forming a polymer layer over the dielectric layer. The method further includes patterning the polymer layer to form an opening, and the semiconductor via is exposed by the opening. The method includes forming a conductive layer in the opening and over the polymer layer, and forming an under bump metallization (UBM) layer on the conductive layer. The method further includes forming an electrical connector over the UBM layer, wherein the electrical connector is electrically connected to the semiconductor via through the UBM layer.

In some embodiments, a method for forming a micro-electro-mechanical system (MEMS) device structure is provided. The method includes forming two trenches from a first surface of a substrate, and forming an isolation layer in the trenches. The method also includes forming a polysilicon layer on the isolation layer and in the trenches, and the polysilicon layer comprises a first portion in the trenches and a second portion below the first surface of the substrate. The method further includes removing a portion of the substrate from a second surface of the substrate to form a semiconductor via, and the semiconductor via is surrounded by the isolation layer. The method includes forming a first bonding layer below the second portion of the polysilicon layer, and bonding the first bonding layer to a micro-electro-mechanical system (MEMS) substrate. The method further includes forming a dielectric layer over the second surface of the substrate, and forming a polymer layer over the dielectric layer. The method includes forming a first opening in the polymer layer, and forming a second opening in the dielectric layer by using the polymer layer as a mask to expose the semiconductor via. The method also includes forming a conductive layer in the opening and over the polymer layer.

In some embodiments, a method for forming a micro-electro-mechanical system (MEMS) device structure is provided. The method includes forming two trenches from a first surface of a substrate, and forming an isolation layer in the trenches. The method also includes forming a polysilicon layer on the isolation layer and in the trenches. The method further includes removing a portion of the substrate from a second surface of the substrate to expose the polysilicon layer, and the exposed polysilicon layer is surrounded by the isolation layer to form an isolation ring. The method includes forming a polymer layer over the second surface of the substrate, and removing a portion of the polymer to form an opening, and the semiconductor via is exposed by the opening. The method further includes forming a conductive layer in the opening and over the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a micro-electro-mechanical system (MEMS) device structure, comprising:
    forming a substrate over a micro-electro-mechanical system (MEMS) substrate, wherein the substrate comprises a semiconductor via;
    forming a dielectric layer over a top surface of the substrate;
    forming a polymer layer over the dielectric layer;
    patterning the polymer layer to form an opening, wherein the semiconductor via is exposed by the opening;
    forming a conductive layer in the opening and over the polymer layer;
    forming an under bump metallization (UBM) layer on the conductive layer; and
    forming an electrical connector over the UBM layer, wherein the electrical connector is electrically connected to the semiconductor via through the UBM layer.

2. The micro-electro-mechanical system (MEMS) device structure as claimed in claim 1, further comprising:
    forming a passivation layer over the polymer layer, wherein a portion of the UBM layer is in the passivation layer, wherein the passivation layer and the polymer layer are made of different materials.

3. The method for forming the micro-electro-mechanical system (MEMS) device structure as claimed in claim 1, wherein forming the substrate over the MEMS substrate comprises:
    forming a first bonding layer on a bottom surface of the substrate;
    forming a second bonding layer on a top surface of the MEMS substrate; and
    bonding the substrate to the MEMS substrate by bonding the first bonding layer and the second bonding layer.

4. The method for forming the micro-electro-mechanical system (MEMS) device structure as claimed in claim 1, further comprising:
    forming two trenches in the substrate;
    forming an isolation layer in sidewalls of the trenches; and
    forming a polysilicon layer over the isolation layer, wherein a portion of the substrate is surrounded by the isolation layer to form the semiconductor via.

5. The method for forming the micro-electro-mechanical system (MEMS) device structure as claimed in claim 1, further comprising:
    forming a plurality of cavities from a bottom surface of the substrate; and
    forming a plurality of the through holes in the MEMS substrate.

6. The method for forming the micro-electro-mechanical system (MEMS) device structure as claimed in claim 1, further comprising:
    forming a semiconductor substrate below the MEMS substrate.

7. The method for forming the micro-electro-mechanical system (MEMS) device structure as claimed in claim 1, wherein the semiconductor via is surrounded by an isolation ring, and the isolation ring comprises:
    a polysilicon layer in a middle of the isolation ring; and
    an isolation layer adjoining the polysilicon layer.

8. The method for forming the micro-electro-mechanical system (MEMS) device structure as claimed in claim 1, wherein the UBM layer has a stair-shaped structure.

9. The method for forming the micro-electro-mechanical system (MEMS) device structure as claimed in claim 1, wherein the electrical connector is directly over the semiconductor via.

10. A method for forming a micro-electro-mechanical system (MEMS) device structure, comprising:
    forming two trenches from a first surface of a substrate;
    forming an isolation layer in the trenches;
    forming a polysilicon layer on the isolation layer and in the trenches, wherein the polysilicon layer comprises a first portion in the trenches and a second portion below the first surface of the substrate;
    removing a portion of the substrate from a second surface of the substrate to form a semiconductor via, wherein the semiconductor via is surrounded by the isolation layer;
    forming a first bonding layer below the second portion of the polysilicon layer;
    bonding the first bonding layer to a micro-electro-mechanical system (MEMS) substrate;
    forming a dielectric layer over the second surface of the substrate;
    forming a polymer layer over the dielectric layer;
    forming a first opening in the polymer layer;
    forming a second opening in the dielectric layer by using the polymer layer as a mask to expose the semiconductor via; and
    forming a conductive layer in the opening and over the polymer layer.

11. The method for forming the micro-electro-mechanical system (MEMS) device structure as claimed in claim 10, further comprising:
    forming an under bump metallization (UBM) layer on the conductive layer; and
    forming an electrical connector over the UBM layer, wherein the electrical connector is electrically connected to the semiconductor via through the UBM layer.

12. The method for forming the micro-electro-mechanical system (MEMS) device structure as claimed in claim 11, further comprising:
    forming a passivation layer over the polymer layer, wherein a portion of the UBM layer is in the passivation layer, wherein the passivation layer and the polymer layer are made of different materials.

13. The method for forming the micro-electro-mechanical system (MEMS) device structure as claimed in claim 11, wherein the UBM layer has a stair-shaped structure.

14. The method for forming the micro-electro-mechanical system (MEMS) device structure as claimed in claim 10, further comprising:
   forming a second bonding layer over the MEMS substrate; and
   bonding the first bonding layer and the second bonding layer.

15. The method for forming the micro-electro-mechanical system (MEMS) device structure as claimed in claim 10, wherein the electrical connector is directly over the semiconductor via.

16. A method for forming a micro-electro-mechanical system (MEMS) device structure, comprising:
   forming two trenches from a first surface of a substrate;
   forming an isolation layer in the trenches;
   forming a polysilicon layer on the isolation layer and in the trenches;
   removing a portion of the substrate from a second surface of the substrate to expose the polysilicon layer, wherein the exposed polysilicon layer is surrounded by the isolation layer to form an isolation ring;
   forming a polymer layer over the second surface of the substrate;
   removing a portion of the polymer to form an opening, wherein the semiconductor via is exposed by the opening; and
   forming a conductive layer in the opening and over the polymer layer.

17. The method for forming the micro-electro-mechanical system (MEMS) device structure as claimed in claim 16, further comprising:
   forming the polysilicon layer on the first side of the substrate; and
   forming a first bonding layer on the polysilicon layer.

18. The method for forming the micro-electro-mechanical system (MEMS) device structure as claimed in claim 16, further comprising:
   forming a second bonding layer on a top surface of a MEMS substrate; and
   bonding the substrate to the MEMS substrate by bonding the first bonding layer and the second bonding layer.

19. The method for forming the micro-electro-mechanical system (MEMS) device structure as claimed in claim 18, further comprising:
   forming a plurality of cavities from the first surface of the substrate; and
   forming a plurality of the through holes in the MEMS substrate.

20. The method for forming the micro-electro-mechanical system (MEMS) device structure as claimed in claim 16, further comprising:
   forming an under bump metallization (UBM) layer on the conductive layer; and
   forming an electrical connector over the UBM layer, wherein the electrical connector is electrically connected to the semiconductor via through the UBM layer.

* * * * *